(12) United States Patent
Moogat et al.

(10) Patent No.: US 7,663,950 B2
(45) Date of Patent: Feb. 16, 2010

(54) METHOD FOR COLUMN REDUNDANCY USING DATA LATCHES IN SOLID-STATE MEMORIES

(75) Inventors: Farookh Moogat, Fremont, CA (US); Raul-Adrian Cernea, Santa Clara, CA (US); Shou-Chang Tsao, San Jose, CA (US); Tai-Yuan Tseng, Milpitas, CA (US)

(73) Assignee: Sandisk Corporation, Milpitas, CA (US)

( * ) Notice: Subject to any disclaimer, the term of this patent is extended or adjusted under 35 U.S.C. 154(b) by 0 days.

(21) Appl. No.: 12/163,017

(22) Filed: Jun. 27, 2008

(65) Prior Publication Data

US 2008/0266957 A1    Oct. 30, 2008

Related U.S. Application Data

(63) Continuation of application No. 11/389,655, filed on Mar. 24, 2006, now Pat. No. 7,394,690.

(51) Int. Cl.
G11C 29/00 (2006.01)
G11C 7/10 (2006.01)

(52) U.S. Cl. .................................. 365/200; 365/189.05

(58) Field of Classification Search .................. 365/200
See application file for complete search history.

(56) References Cited

U.S. PATENT DOCUMENTS

| | | |
|---|---|---|
| 4,281,398 A | 7/1981 | McKenny et al. |
| 5,070,032 A | 12/1991 | Yuan et al. |
| 5,095,344 A | 3/1992 | Harari |
| 5,172,338 A | 12/1992 | Mehrotra et al. |
| 5,200,959 A | 4/1993 | Gross et al. |
| 5,231,604 A | 7/1993 | Watanabe |
| 5,313,421 A | 5/1994 | Guterman et al. |
| 5,315,541 A | 5/1994 | Harari et al. |
| 5,343,063 A | 8/1994 | Yuan et al. |
| 5,418,752 A | 5/1995 | Harari et al. |
| 5,428,621 A | 6/1995 | Mehrotra et al. |

(Continued)

FOREIGN PATENT DOCUMENTS

EP        0 430 682 A2    6/1991

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

Primary Examiner—Son L Mai
(74) Attorney, Agent, or Firm—Davis Wright Tremaine LLP

(57) ABSTRACT

A memory has defective locations in its user portion replaceable by redundant locations in a redundant portion. Data latches in the user and redundant portions allow data sensed from or to be written to a memory to be exchanged with a data bus. A defective location latching redundancy scheme assumes the column circuits including data latches for defective columns to be still useable. The data latches for the defective columns are used to buffer corresponding redundant data that are normally accessible from their data latches in the redundant portion. In this way both the user and redundant data are available from the user data latches, and streaming data into or out of the data bus is simplified and performance improved.

20 Claims, 18 Drawing Sheets

READ OPERATION USING REDUNDANT DATA BUFFERED IN DATA LATCHES OF DEFECTIVE COLUMNS

U.S. PATENT DOCUMENTS

| | | | |
|---|---|---|---|
| 5,570,315 | A | 10/1996 | Tanaka et al. |
| 5,595,924 | A | 1/1997 | Yuan et al. |
| 5,602,987 | A | 2/1997 | Harari et al. |
| 5,661,053 | A | 8/1997 | Yuan |
| 5,768,192 | A | 6/1998 | Eitan |
| 5,774,397 | A | 6/1998 | Endoh et al. |
| 5,808,946 | A | 9/1998 | Roohparvar |
| 5,903,495 | A | 5/1999 | Takeuchi et al. |
| 6,011,725 | A | 1/2000 | Eitan |
| 6,046,935 | A | 4/2000 | Takeuchi et al. |
| 6,104,646 | A | 8/2000 | Haga |
| 6,149,316 | A | 11/2000 | Harari et al. |
| 6,172,916 | B1 | 1/2001 | Ooishi |
| 6,201,744 | B1 | 3/2001 | Takahashi |
| 6,222,762 | B1 | 4/2001 | Guterman et al. |
| 6,462,994 | B2 | 10/2002 | Kim |
| 6,480,415 | B2 * | 11/2002 | Makuta et al. ......... 365/185.09 |
| 6,556,479 | B2 | 4/2003 | Makuta et al. |
| 6,661,706 | B2 | 12/2003 | Kawai et al. |
| 6,684,345 | B2 | 1/2004 | Harari et al. |
| 6,816,420 | B1 | 11/2004 | Liu et al. |
| 6,868,021 | B2 | 3/2005 | Tanabe et al. |
| 6,891,753 | B2 | 5/2005 | Cernea |
| 7,224,605 | B1 | 5/2007 | Moogat et al. |
| 7,324,389 | B2 | 1/2008 | Cernea |
| 7,352,635 | B2 | 4/2008 | Cernea |
| 7,394,690 | B2 * | 7/2008 | Moogat et al. ......... 365/185.09 |
| 2002/0044489 | A1 | 4/2002 | Kim |
| 2004/0062096 | A1 | 4/2004 | Tanabe et al. |
| 2005/0141387 | A1 | 6/2005 | Cernea et al. |
| 2006/0061795 | A1 | 3/2006 | Walmsley |
| 2006/0140007 | A1 | 6/2006 | Cernea et al. |
| 2007/0220935 | A1 | 9/2007 | Cernea |
| 2007/0223291 | A1 | 9/2007 | Cernea |

OTHER PUBLICATIONS

USPTO, "Notice of Allowance and Fee(s) Due," mailed in related U.S. Appl. No. 11/388,408 on Apr. 13, 2007, 8 pages.

EPO/ISA, "Notification of Transmittal of the International Search Report and the Written Opinion of the International Searching Authority, or the Declaration," mailed in related International Patent Application No. PCT/US2007/063863 on Sep. 14, 2007, 12 pages.

USPTO, "Notice of Allowance and Fee(s) Due," mailed in related U.S. Appl. No. 11/389,655 on Feb. 26, 2008, 25 pages.

* cited by examiner

READ TIMING  *(Prior Art)*

PROGRAM TIMING  *(Prior Art)*

READ OPERATION *(Prior Art)*

TIMING FOR READ WITH REMOTE REDUNDANCY

READ WITH REDUNDANT DATA BUFFER

TRANSFER TO DATA REGISTERS

TIMING FOR WRITE WITH REMOTE REDUNDANCY

TRANSFER BETWEEN REDUNDANT AND USER DATA LATCHES

TIMING FOR READ WITH REDUNDANT DATA IN LATCHES OF DEFECTIVE LOCATIONS

READ OPERATION USING REDUNDANT DATA BUFFERED IN
DATA LATCHES OF DEFECTIVE COLUMNS

TIMING FOR WRITE WITH REDUNDANT DATA IN LATCHES OF DEFECTIVE LOCATIONS

WRITE OPERATION USING REDUNDANT DATA BUFFERED
IN DATA LATCHES OF DEFECTIVE COLUMNS

METHOD FOR COLUMN REDUNDANCY USING DATA LATCHES IN SOLID-STATE MEMORIES

CROSS REFERENCE TO RELATED APPLICATION

This application is a continuation of application Ser. No. 11/389,655 filed on Mar. 24, 2006, entitled "Method for Column Redundancy Using Data Latches in Solid-State Memories," by Moogat et al. This application is related to an application Ser. No. 11/388,408, filed on Mar. 24, 2006, entitled "Non-Volatile Memory with Redundancy Data Buffered in Data Latches for Defective Locations," by the same inventors, now U.S. Pat. No. 7,224,605. This application is further related to application Ser. No. 11/388,579, filed on Mar. 24, 2006, by Raul-Adrian Cernea, entitled "Non-Volatile Memory with Redundancy Data Buffered in Remote Buffer Circuits," now U.S. Pat. No. 7,352,635; application Ser. No. 11/389,411, filed on Mar. 24, 2006, by Raul-Adrian Cernea, entitled "Method for Remote Redundancy for Non-Volatile Memory," now U.S. Pat. No. 7,324,389 and application Ser. No. 12/019,564, filed on Jan. 24, 2008, by Raul-Adrian Cernea, entitled "Non-Volatile Memory With Redundancy Data Buffered in Remote Buffer Circuits." The cited applications are incorporated herein in their entirety by this reference.

FIELD OF THE INVENTION

This invention relates generally to non-volatile semiconductor memory such as electrically erasable programmable read-only memory (EEPROM) and flash EEPROM, and specifically ones implementing column redundancy features.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. In spite of the higher cost compared to magnetic disk storage, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card are ideally suited in the mobile and handheld environment because of its small size, low power consumption, high speed and high reliability features.

The memory devices typically comprise one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. There are many commercially successful non-volatile solid-state memory devices being used today. These memory devices may employ different types of memory cells, each type having one or more charge storage element. Examples of EEPROMs and methods of manufacturing them are given in U.S. Pat. No. 5,595,924. Examples of flash EEPROMs, their uses in memory systems and methods of manufacturing them are given in U.S. Pat. Nos. 5,070,032, 5,095,344, 5,315,541, 5,343,063, 5,661,053, 5,313,421 and 6,222,762. Examples of memory devices with NAND cell structures are described in U.S. Pat. Nos. 5,570,315, 5,903,495, and 6,046,935. Examples of memory devices with a dielectric layer for storing charge have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

A memory device is usually organized as a two-dimensional array of memory cells arranged in rows and columns and addressable by word lines and bit lines. The array can be formed according to an NOR type or an NAND type architecture. Examples of NOR type memories are disclosed in U.S. Pat. Nos. 5,172,338 and 5,418,752. Examples of NAND architecture arrays and their operation as part of a memory system are found in U.S. Pat. Nos. 5,570,315, 5,774,397 and 6,046,935.

A memory will often have defective portions, either from the manufacturing process or that arising during the operation of the device. In particular, in order to maximize manufacturing yield, defects found upon manufacturing are corrected to salvage an otherwise defective product. A number of techniques exists for managing these defects including error correction coding or remapping portions of the memory, such as described in U.S. Pat. Nos. 5,602,987, 5,315,541, 5,200,959, 5,428,621, and US 2005/0141387 A1. The discloures of these publications are hereby incorporated herein by reference.

After manufacturing, a memory chip is tested prior to shipment. If a defect is found, the chip may be salvageable by substituting the defective portion of the memory with a redundant portion. A common type of defect found in memory is due to problems in a column of the array. For example, in a flash memory a column defect may be due to any one of the following errors in the memory cell area: bit line to bit line shorts; bit line shorted to other signals; bit line opens; bad cells that do not program or are too slow to program; and/or bad data latches.

Conventional column redundancy scheme replaces the whole column, including the bit lines, sense amplifiers, and data latches within in the column. The redundancy scheme also has is a high speed match circuit along with separate access signals which get enabled when a bad column is encountered.

One prior art system managing defective columns on the memory chip itself uses a binary decoding scheme to manage bad column replacement. The address from the host is first latched into a register and the column address is incremented by a 10-bit adder to manage the columns from 0 to 540 bytes. The column address (10 bits) is then pre-decoded into 15 to 20 lines which run through the column decoder area. Three signals are chosen from among these 15 to 20 lines to form a column select. Bad columns in this binary decoding system are managed by comparing an incoming column address with a list of bad column addresses. If a match is found, the incoming column address is reassigned to another, good column address. If the incoming address does not match the bad column addresses, the incoming column address is not changed. The binary column select scheme has a high degree of flexibility in locating random column addresses. However, it has the disadvantage is that it is relatively slow because of the multiple stages of logic necessary to replace a defective column, and this makes it difficult for the binary decoding scheme to run much faster than a 20 MHz data input or output rate.

Also, in the case of a memory array with an architecture serviced by sets of sense amplifiers from both top and bottom of the array, defective columns may not be efficiently remapped due to the location of a redundant column relative to each set of sense amplifiers.

Therefore there is a general need for high performance and high capacity non-volatile memory with improved performance. In particular, there is a need for defect management with improved performance and efficiency.

SUMMARY OF INVENTION

Redundant Data Buffered in Data Latches of Defective Columns

According to another aspect of the invention, a defective column latching redundancy scheme has the redundant or substitute data for defective memory locations relocated from the redundant data latches to a more readily accessible location such as the data latches of the corresponding defection columns. This scheme is predicated on the fact that a defective column is usually caused by problems in the bit lines and not so much in the associated column circuits. Thus for example, while the bit lines may be shorted and become unusable, their associated data latches and column decoders are likely to remain operational. The invention recognizes that when memory operations such as sensing and programming cannot be performed via the defective bit lines, they column circuits can still be used to buffer data.

In a preferred embodiment, the data latches associated with the defective locations are employed to buffer the substitute data that are conventionally stored in the data latches associated with the corresponding redundant locations. In this way, the user portion of can be treated as if virtually free of defects as far as streaming data out to the data bus is concerned. Thus, only the addressing scheme for addressing the user portion is needed and there is no need to switch to the redundant data latches whenever a defective location is encountered.

In a read operation, the page including both user and redundant data is first sensed and latched. An additional operation is called for to place a copy of the redundant data from the redundant data latches to the data latches associated with the corresponding defective columns in the user portion. In this way, when the data is output to a data bus, only the user data latches need be accessed, regardless of any defective columns.

In a write operation, a page of data to be written is first latched into the user data latches regardless of any defective columns. In this way, the user portion can be treated as if virtually free of defects as far streaming in data from the data bus is concerned. An additional operation is called for to place a copy of the data from the data latches associated with the defective columns to corresponding redundant data latches. Predefined data indicating a no-program condition are also stored into the data latches of the defective column to indicate them as such. Then the whole page including data from both the user data latches and the redundant data latches can be programmed into the respective memory cells.

Additional features and advantages of the present invention will be understood from the following description of its preferred embodiments, which description should be taken in conjunction with the accompanying drawings.

DETAILED DESCRIPTION OF THE PREFERRED EMBODIMENTS

A preliminary description of a typical memory employing column redundancy is useful to distinguish from the present invention.

Conventional Localized Redundant Data Scheme

Figure 1:
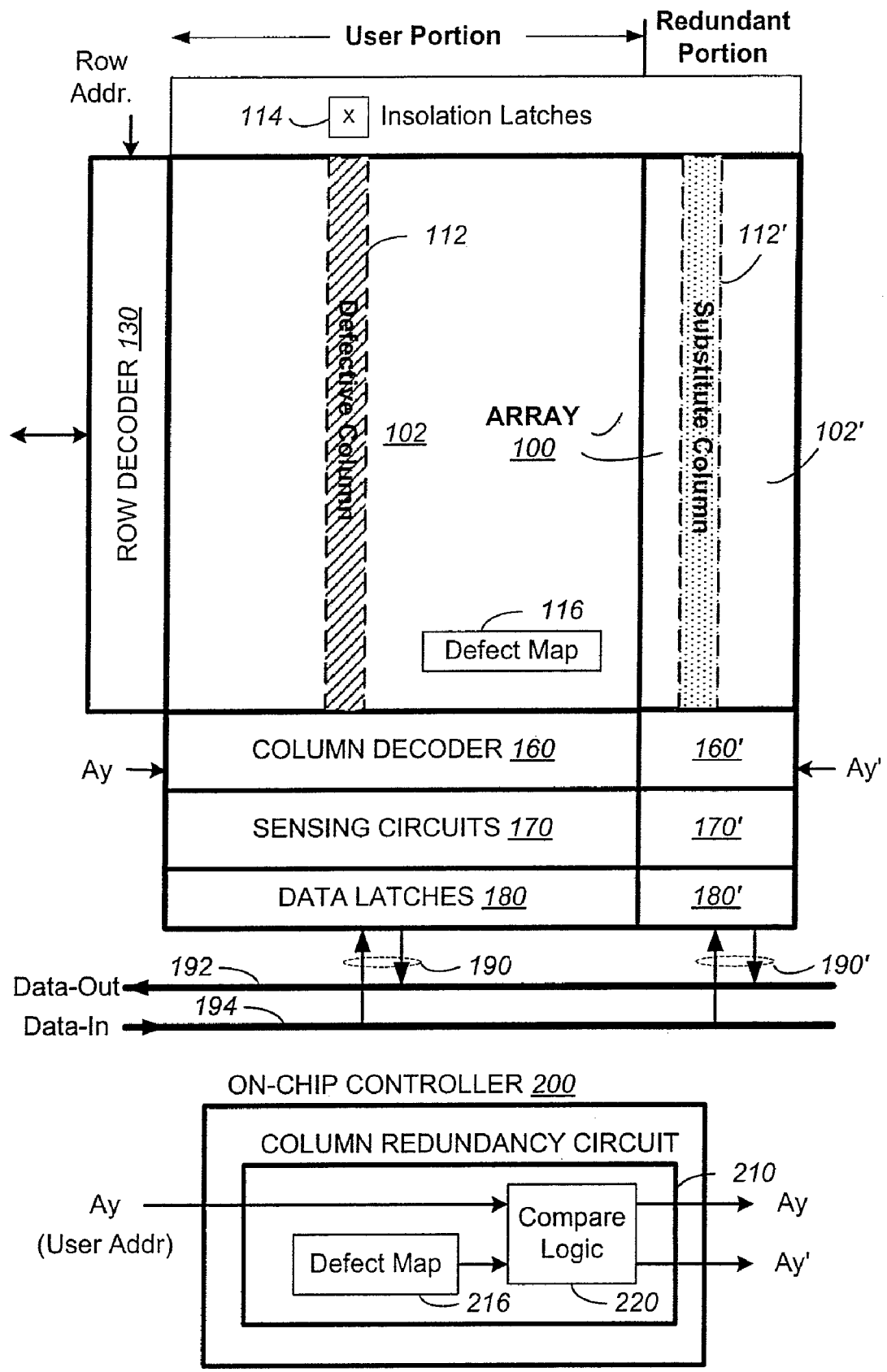
FIG. 1 illustrates a memory device with a conventional scheme of column redundancy in which redundant data is available only from the redundant portion.

FIG. 1 illustrates a memory device with a conventional scheme of column redundancy in which redundant data is available only from the redundant portion. The memory device has an array of memory cells 100 which is partitioned into a user portion 102 and a redundant portion 102'. The memory cells in the array 100 are accessible by a set of word lines along a row and a set of bit lines along a column. The set of word lines is selectable by a row address via a row decoder 130. Similarly, the set of bit lines is selectable by a column address via a column decoder 160. Typically, a page of memory cells along a row is read or written together by a corresponding set of sensing circuits 170. A corresponding set of data latches 180 is used to latch the page of data that has been read from the memory or that are to be written to the memory. At the end of a read operation, data from the data latches are transferred out via a data-out bus 192. Similarly, at the beginning of a write operation, data to be written are transferred via the data-in 194 bus to the data latches.

Typically the column address has a granularity that a group of bit lines in a column is addressable at a time and therefore bit line defects are mapped column by column. For example, an addressable column may contain eight or sixteen bit lines, corresponding to a byte or a word of data along a given row.

When a defective column such as 112 is identified in the user portion 102, a substitute column such as column 112' form the redundant portion 102' is provided to replace it. Bad columns are found during tests and the information on any defective columns and their substitution is maintained in a defect map 116 that can be stored in the memory device, such as in the memory array (ROMFUSE block) which is read at power up. Whenever the memory device is powered up, the defect map is loaded into the RAM 216 of an on-chip controller 200 for quick access.

Typically, the user can only access the user portion 102 of the array and is not allowed to access the redundant portion 102'. Thus, column address range Ay is for the user to access the user portion 102 only. A protected set of column address Ay' is for the system to access the redundant portion 102'. The redundant portion 102' of the array is serviced by its own set of column circuits, such as redundant column decoder 160', redundant sensing circuits 170' and redundant data latches 180'.

Each defective column can be tagged by an isolation latch. In that case, the addressed byte or word in the column will not be programmed irrespective of the data in the data latches for that column and will already be ignored during program verify.

Typical prior art systems manage defective columns on the memory chip itself uses a 2-way decoding scheme to manage bad column replacement. The user address Ay is transformed into either address Ay for accessing the user array or address Ay' for accessing the redundant array.

Bad columns in this 2-way decoding system are managed by comparing an incoming (user) column address Ay with a list of bad column addresses in the defect map 216. If a match is found, the incoming column address Ay is reassigned or mapped to another, good column address Ay' (Ay→Ay') in the redundant portion 102'. If the incoming address does not match the bad column addresses, the incoming column address is not changed (Ay→Ay).

For example, after a sensing operation, a page of read data is latched into the data latches. When the user requests the data, they will be streamed out to the data bus 190 via line 194. When the address points to a bad column, e.g., column 3, a column redundancy module 210 will disable the address Ay for the user array and instead enable the address Ay' to address a redundant or substitute column in the redundant portion of the array instead. In that case, data from the redundant column will be inserted on-the-fly into the stream to the data-out bus 192 via line 190'.

Figure 2A:
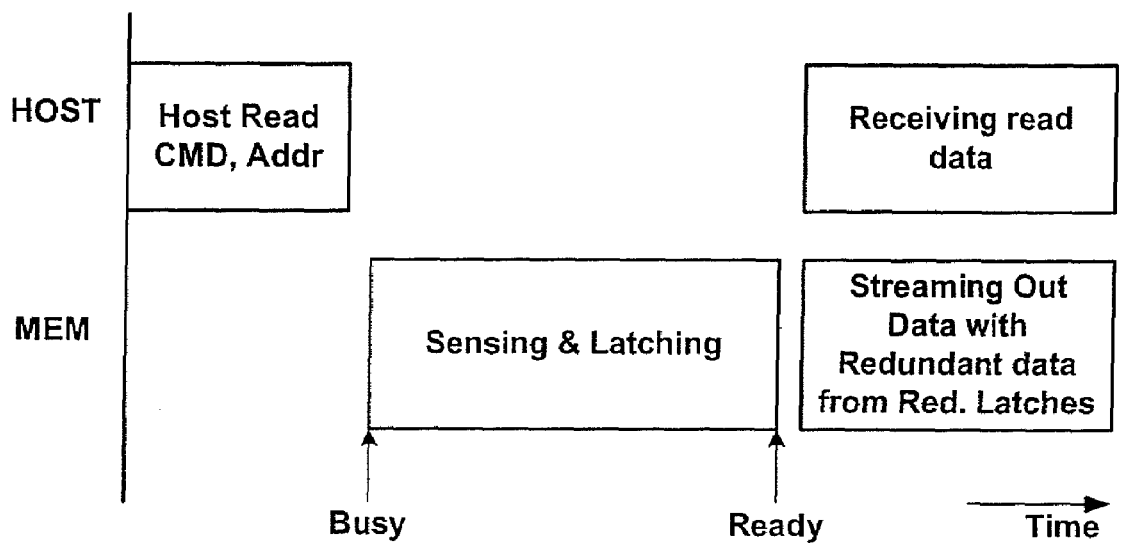
FIG. 2A is a schematic timing diagram of a read operation with a conventional redundancy scheme.

FIG. 2A is a schematic timing diagram of a read operation with a conventional redundancy scheme. A host initiates the read operation in the memory device by issuing an initial read command to begin sending the starting read address. This is followed by sending the actual starting read address. Then the host issues the command to execute read. The memory device then signals a BUSY signal and operates to sense a page of data. The page of sensed data is latched into the associated data latches. The page will include the user portion and redundant portion of the array. When all the data are latched, the memory device signals with a READY signal.

A user can then request through the host to stream out the data from the data latches to the data-out bus 192. During the streaming out operation, whenever a defective column is encountered, the user address Ay is switched to Ay' to address the corresponding redundant data latches in the redundant portion so that the corresponding redundant data can be inserted into the stream on-the-fly. When the redundant data are output to the bus, the memory switches back to the user address Ay and this process continues until the end of the page is reached.

Figure 2B:
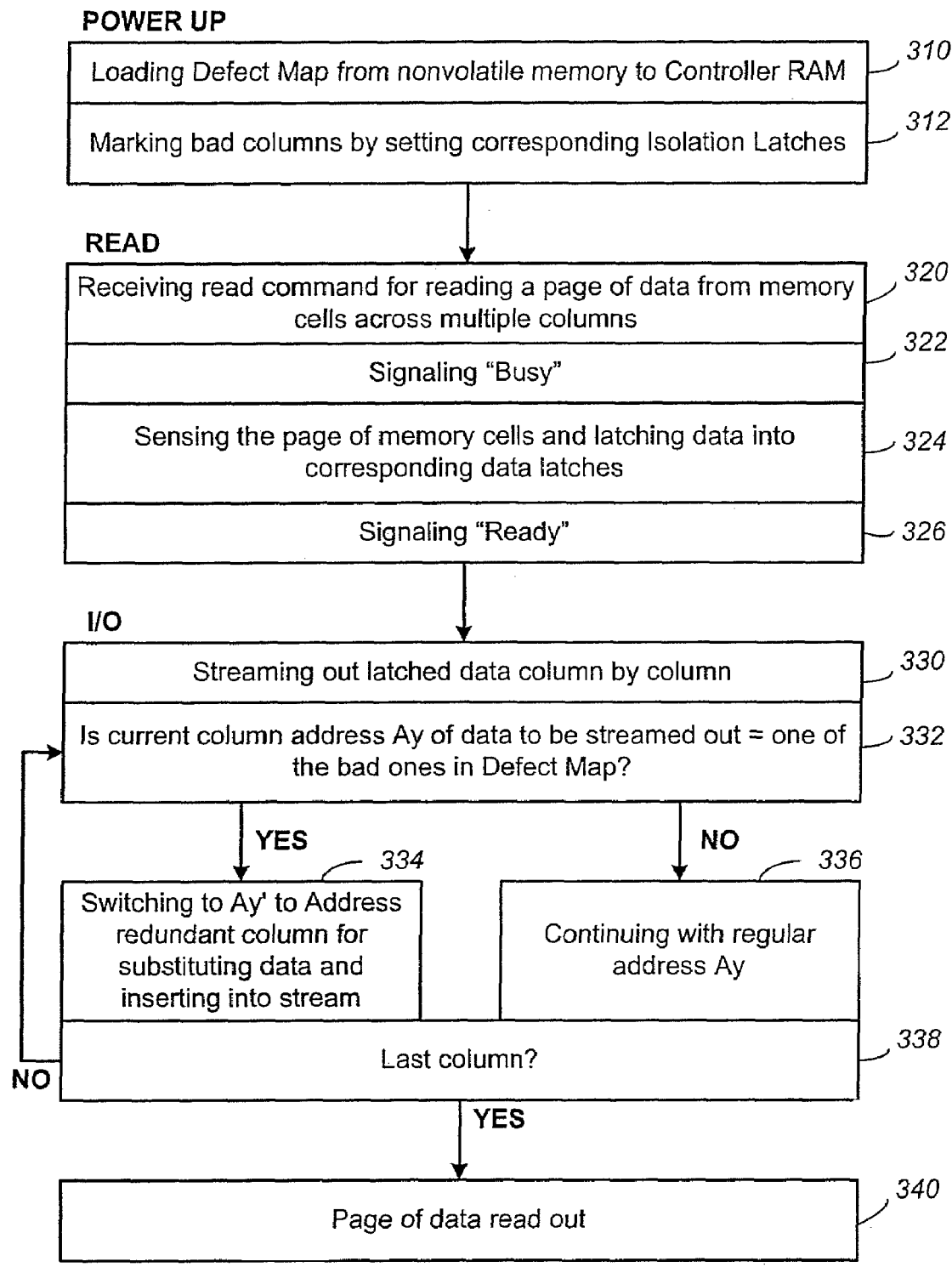
FIG. 2B is a flowchart that illustrates a read operation with a conventional column redundancy scheme.

FIG. 2B is a flowchart that illustrates a read operation with a conventional column redundancy scheme.

Power Up step 310: Loading Defect Map from nonvolatile memory to Controller RAM.

step 312: Marking bad columns by setting corresponding Isolation Latches. Read step 320: Receiving read command for reading a page of data from memory cells across multiple columns step 322: Signaling "Busy".

step 324: Sensing the page of memory cells and latching data into corresponding data latches.

step 326: Signaling "Ready".

I/O step 330: Streaming out latched data column by column.

step 332: Is current column address Ay of data to be streamed out=one of the bad ones in Defect Map? If there is a match, proceeding to STEP 334, otherwise proceeding to STEP 336.

step 334: Switching to Ay' to Address redundant column for substituting data and inserting into stream, and proceeding to STEP 338.

step 336: Continuing with regular address Ay, and proceeding to STEP 338.

step 338: Last column? Proceeding to STEP 340 if the last column is reached, otherwise proceeding to the next column in STEP 332.

step 340: Page of data read out.

Figure 3A:
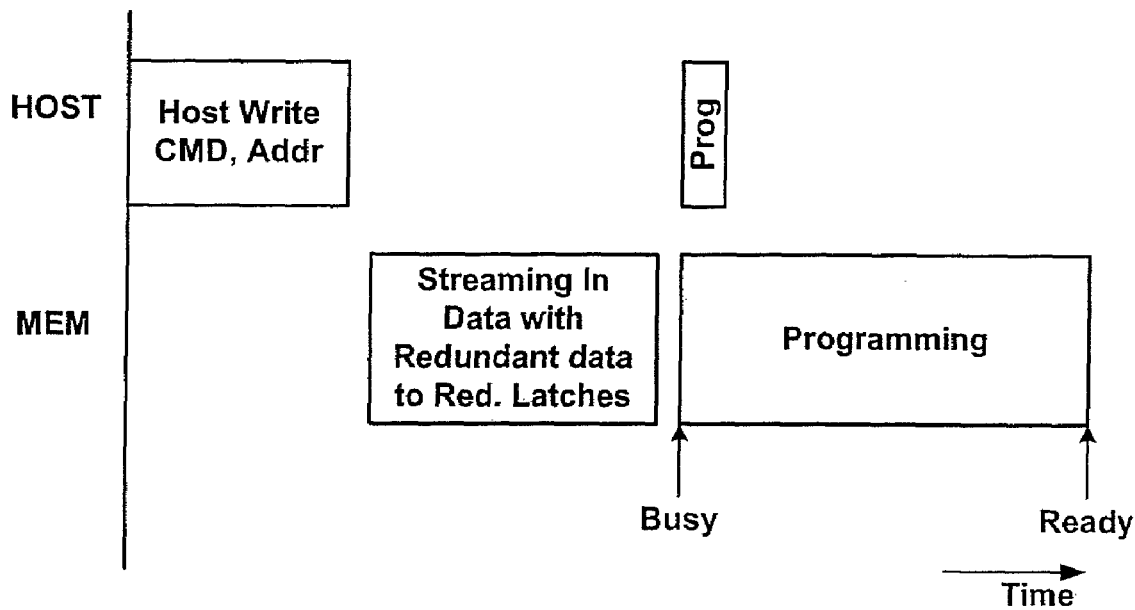
FIG. 3A is a schematic timing diagram of a write operation with a conventional redundancy scheme.

FIG. 3A is a schematic timing diagram of a write operation with a conventional redundancy scheme. The data transfer in a write operation is similar to that of the read operation, except streaming of program data from the bus to the data latches takes place before programming. For example, when it comes to a defective column 3, instead of streaming data to the data latches for column 3, it is redirected to the substituting column.

A host initiates the write operation in the memory device by issuing an initial write command to begin sending the starting write address. This is followed by sending the actual starting write address. The host can then issue a signal to stream in the write data from the data-in bus 192 to the data latches. During the streaming in operation, whenever a defective column is encountered, the user address Ay is switched to Ay' to address the corresponding redundant data latches in the redundant portion so that the corresponding redundant data can be inserted into the corresponding redundant latches on-the-fly. When the redundant data have been latched, the memory switches back to the user address Ay and this streaming process continues until the end of the page is reached.

Then the host issues the command to execute programming. The memory device then signals a BUSY signal and operates to program a page of data. The page will include the user portion and redundant portion of the array. When all the data are program verified, the memory device signals with a READY signal.

Figure 3B:
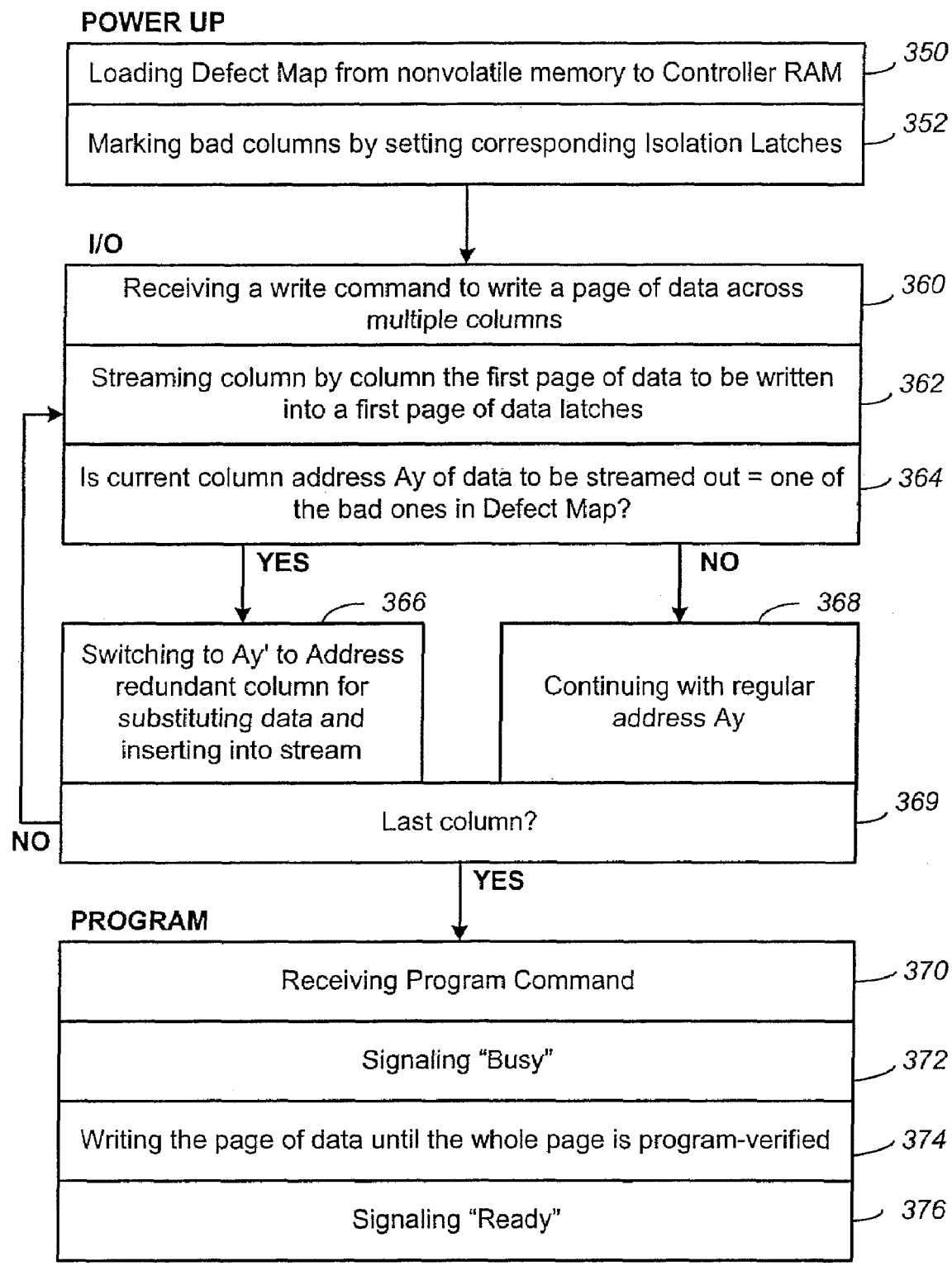
FIG. 3B is a flowchart that illustrates a program operation with a conventional column redundancy scheme.

FIG. 3B is a flowchart that illustrates a program operation with a conventional column redundancy scheme.

Power Up step 350: Loading Defect Map from nonvolatile memory to Controller RAM.

step 352: Marking bad columns by setting corresponding Isolation Latches.

I/O step 360: Receiving a write command to write a page of data across multiple columns.

step 362: Streaming column by column the first page of data to be written into a first page of data latches.

step 364: Is current column address Ay of data to be streamed out=one of the bad ones in Defect Map? If there is a match, proceeding to STEP 366, otherwise proceeding to STEP 368.

step 366: Switching to Ay' to Address redundant column for substituting data and inserting into stream, and proceeding to STEP 369.

STEP 368: Continuing with regular address Ay, and proceeding to STEP 369.

STEP 369: Last column? Proceeding to STEP 370 if the last column is reached, otherwise proceeding to the next column in STEP 362.

Program step 370: Receiving Program Command.

step 372: Signaling "Busy".

step 374: Writing the page of data until the whole page is program-verified.

step 376: Signaling "Ready".

The 2-way column select scheme is more flexible in being able to random-access a column. However, it has the disadvantage is that it is relatively slow because of the multiple stages of logic necessary to replace a defective column. As mentioned before, the redundant portion of the array is protected from user access, hence it has its own unique address signals. Switching between the user portion and the redundant portion on-the-fly will necessitate switching between two entirely different addressing schemes, and this makes it difficult for the 2-way decoding scheme to run much faster than a 20 MHz data input or output rate.

Remote Redundancy Scheme

According to one aspect of the invention, a remote redundancy scheme has the redundant or substitute data for defective memory locations relocated from the redundant data latches to a set of buffer circuits. In this way, the redundant data are in a more readily accessible location such that one addressing scheme is necessary to exchange data between the memory array and the I/O bus. In particular, in the present remote redundancy scheme, user data are associated with user data latches and redundant data with redundant data latches, but the addresses for the user portion of the memory array can be used to access user data and any redundant data substituting therefore. When the current address is for a good (non-defective) location, the data bus exchanges data with the user data latches. On the other hand, when the current address is for a defective location, the data bus exchanges data with a remote buffer that has the redundant data loaded in it.

In a preferred embodiment, redundant data buffer circuits are employed to buffer the substitute data associated with the latches of the redundant portion. Only the addressing scheme for addressing the user portion is needed. Normally, data are exchanged between the I/O bus and the data latches of the user portion. When a defective address location is encountered, substitute data are exchanged between the I/O bus and the more accessible buffer circuits instead of the data latches in the redundant portion.

Figure 4:
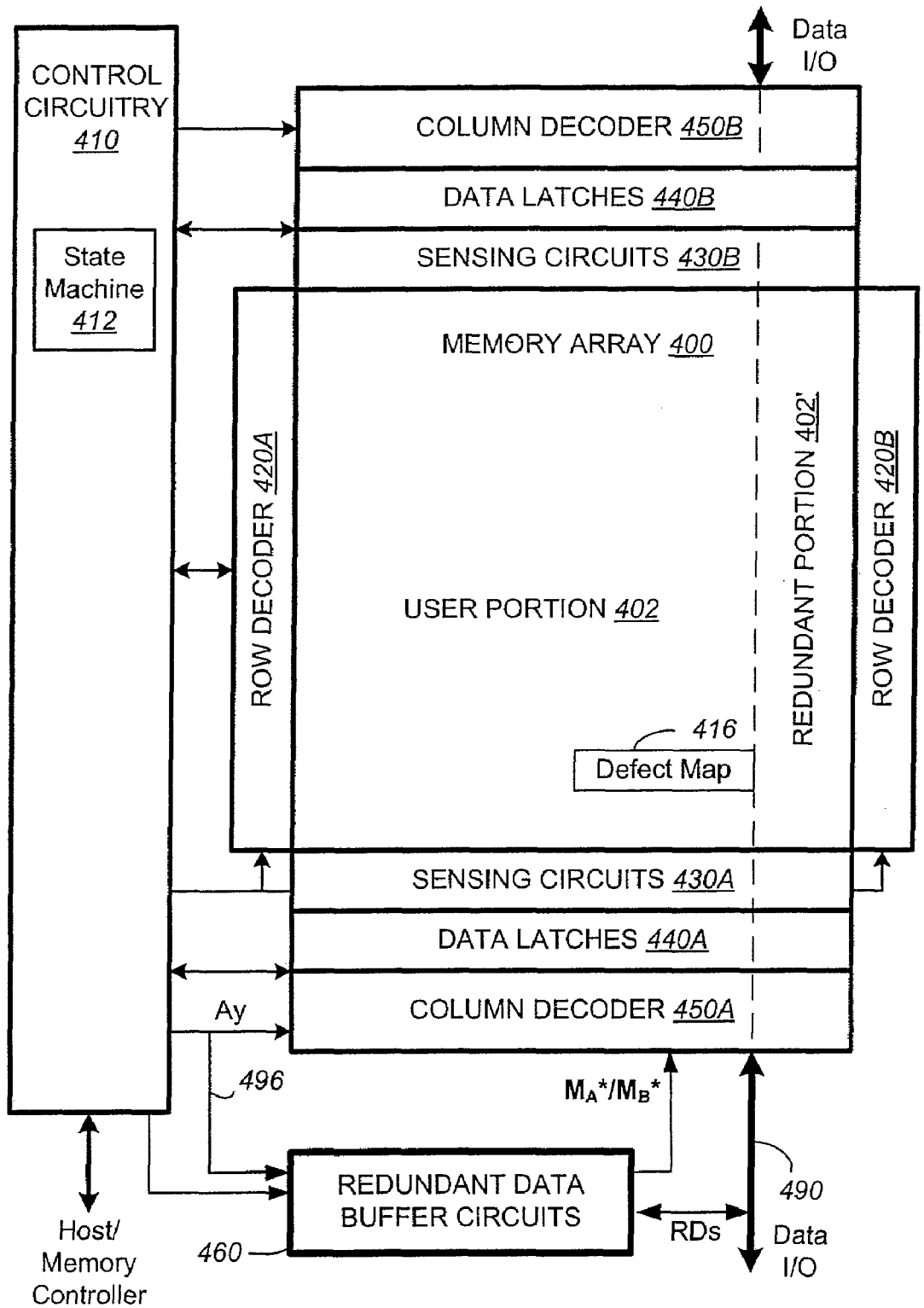
FIG. 4 illustrates schematically a preferred arrangement of a compact memory device that provides the context in which the remote redundancy scheme is implemented.

FIG. 4 illustrates schematically a preferred arrangement of a compact memory device that provides the context in which the remote redundancy scheme is implemented. The memory device includes a two-dimensional array of individual storage units or memory cells 400, control circuitry 410, row decoders 420A and 420B and column circuits. In one embodiment, the storage units individually are capable of storing one bit of data. In another embodiment the storage units individually are capable of storing more than one bit of data. In the most preferred embodiment, the compact memory device is implemented in a memory card that can be removably attached to a host system.

The memory array 400 is addressable by word lines via the row decoders 420A, 420B and by bit lines coupled to the column circuits. The column circuits include sensing circuits 430A, 430B, data latches 440A, 440B and column decoders 450A, 450B and data I/O bus 490. It will be understood that there is a set of data latches for each sensing circuit. For example, in a 4-state memory where each memory cell is capable of storing two bits of data, there could be latches to store two or more bits of information. A set of data latches for storing multi-bit is disclosed in U.S. patent application Ser. No. 11/026,536, filed Dec. 29, 2004 and entitled, "Non-Volatile Memory and Method with Shared Processing for an Aggregate of Read/Write Circuits," the entire disclosure of which is hereby incorporated herein by reference.

In the preferred embodiment, there is a sensing circuit among circuits 430A coupled to all the even bit lines and a sensing circuit among circuits 430B coupled to all the odd bit lines. In this way, when operating together, all the bit lines are being used in parallel. In another embodiment, only every other bit lines, even or odd, are operating in parallel.

The row decoders and the column circuits are preferably distributed on both ends of the array in order to accommodate dense packing. Hence, row decoders 420A and 420B are respectively deployed at the left and right sides of the array. Similarly, column circuits "A" and "B" are respectively deployed at the bottom and top of the array. Typically, column circuits "A" and "B" respectively access interleaving sets of bit lines. For example, column circuits "A" have access to even number bit lines and column circuits "B" have access to odd number bit lines. For expediency, unless specifically noted, hereinafter the description will be directed to one set of the circuits, such as the "A" circuits.

The sensing circuits 430A of the column circuits are implemented as a bank of sense amplifiers that allows a block (also referred to as a "page") of memory cells along a row to be read or programmed in parallel. In a preferred embodiment, a page is constituted from a contiguous row of memory cells, such as 1024 bytes. In another embodiment, a row of memory cells are partitioned into multiple blocks or pages, e.g., a page with even bit lines and a page with odd bit lines.

The control circuitry 410 cooperates with row decoders and the column circuits to perform memory operations on the memory array 400. A state machine 412 in the control circuitry provides chip-level control of memory operations.

The memory array 400 is further partitioned into a user portion 402 and a redundant portion 402'. The user portion 402 is accessible column by column by user address Ay supplied via an address bus 496. The redundant portion 402' cannot be accessed by the user and has its own protected addressing Ay'. The redundant portion provides a predetermined number of redundant or substitute columns for replacement of any defective columns found in the user portion. A listing of defective columns is registered in a defect map 416, which is preferably stored in the non-volatile memory array 402. For example, the redundant region 402' may provide eight substitute columns each being one byte wide. This would in principle allow replacement of up to eight defective columns that may arise in the user portion.

However, due to localization of the redundant or substitute data at the latches of the redundant columns in prior art systems, a further issue may arise with the tier structure of the preferred arrangement shown in FIG. 4 where the bottom and top column circuits each have access to even or odd columns only. If the two-tier architecture is implemented in the prior art system described in FIG. 1, each of the bottom and top column circuits would have access to half of the pool of substitute columns in the redundant portion. This is because, an odd column circuits can not access even substitute columns and vice versa. The result would be inefficient utilization of the pool of substitute columns. For example, with a pool of eight redundant columns (four even and four odd columns), the fifth defective column among even columns in the user portion could no longer be replaced, even though there are in fact eight substitute columns in the pool.

FIG. 4 shows a preferred embodiment in which the redundant data buffer circuits cooperate with the memory device to provide remote redundancy service. The redundant data associated with the redundant portion 402' are buffered in the redundant data buffer circuits 460. For the sake of clarity, data transferred to the data out bus 492 will be described in connection with FIG. 5. Data transferred from the data-in bus will be described in connection with FIG. 6.

Figure 5:
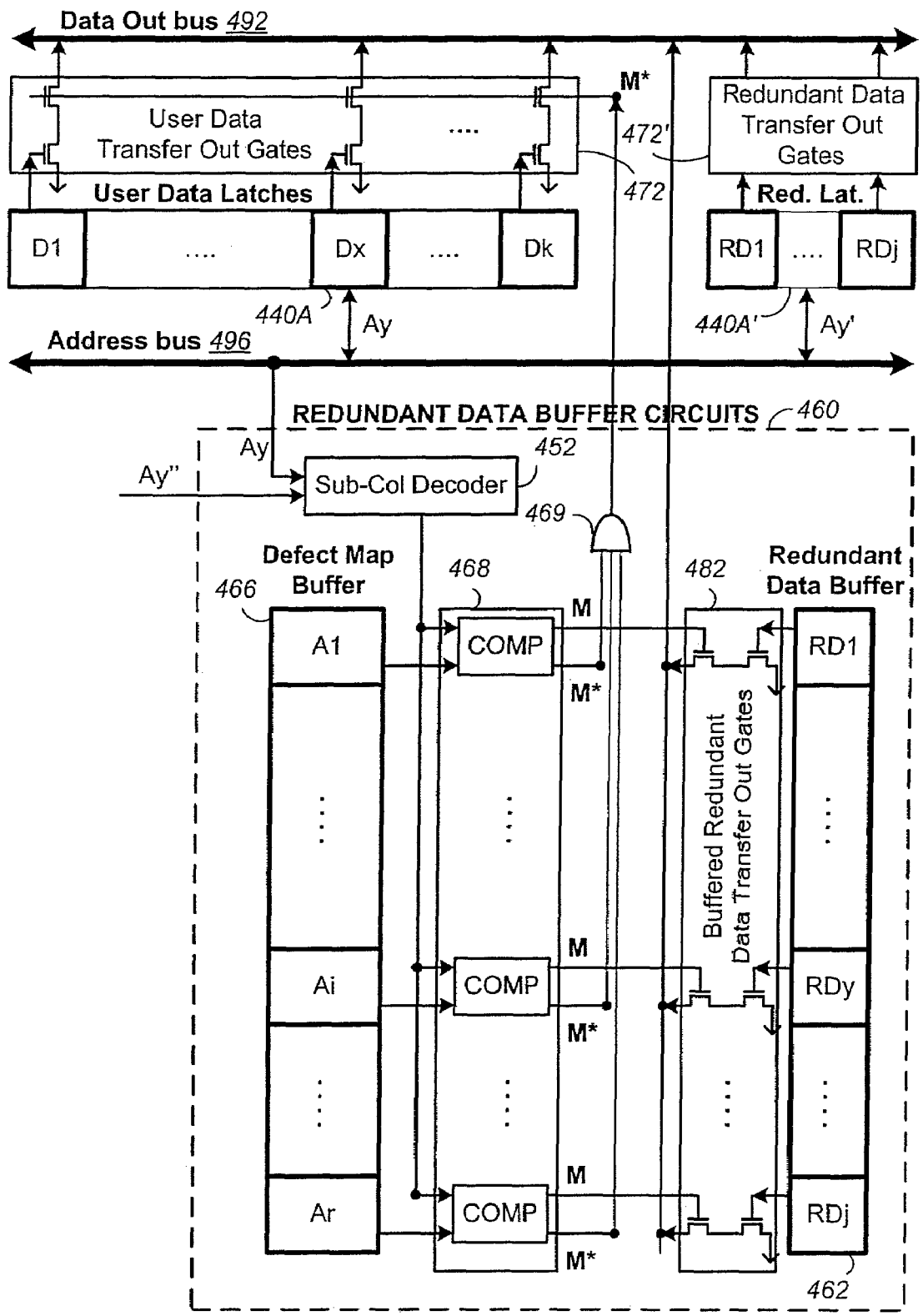
FIG. 5 illustrates the redundant data buffer circuits configured to transfer data out to the I/O bus.

FIG. 5 illustrates the redundant data buffer circuits configured to transfer data out to the I/O bus. This transfer-out mode is applicable after a sensing operation when a page of sensed data has been latched into the set of user data latches 440A. A user can access data within the page of data by a column address Ay supplied through the address bus 496. As described before, depending on the granularity of the addressing, a column containing a predetermined number of bit lines is addressable as a unit. When a run of columns are to be addressed, a preferred addressing scheme would be to supply the starting address followed by a run length. The column selection is effected when the column address is decoded by the column decoder 450A (see FIG. 4.) In FIG. 5 the column selection is depicted schematically by a pointer from the address bus 496. The column circuits also include a set of user-data-transfer-out gates 472 that controls the transfer of the selected latched data to the I/O bus 492.

The redundant data buffer circuits 460 include a redundant data buffer 462, a set of transfer-out gates 482, a defect map buffer 466 and a compare circuit 468. The redundant data buffer buffers redundant data from the redundant portion 402'. After sensing of a page of data, the redundant data latched in the redundant latches 440A' are loaded into the redundant data buffer 462. The transferring to the redundant data buffer 462 is performed when the redundant data buffer circuits 460 is configured in a mode with the data-out bus 492 receiving data from the redundant data latches and transferring to the redundant data buffer as will be shown in FIG. 6. Similarly, the defect map buffer 466 buffers a list of defects maintained in the defect map 416, and it is loaded into the buffer 466 on power-up of the memory device.

In the preferred embodiment, both redundant data buffer 462 and the defect map buffer 466 comprise a set of individual registers for storing individual entries of data. The addresses of the defective columns are stored in a predefined order into the individual registers of the defect map buffer 466. Similarly, the individual redundant data associated with each of the individual addresses are stored in the redundant data buffer 462 such that there is a register-to-register correspondence between a defect address and its associated redundant data. In this way, unlike conventional scheme, the defect map need not contain an index for locating the associated redundant data.

The compare circuit 468 is a one-to-many comparator that essentially provides an individual comparator for each of the entries in the defect map buffer. Each individual comparator compares a common input address with one of the address entries in the defect map buffer as stored in one of its individual registers. In another embodiment described below, a sub-column decoder 452 is optionally used to resolve the addressing at the redundant data buffer to a finer level than that of the memory array. If that option is not implemented, then the input address to the redundant data buffer is essentially the column address Ay. Thus, when the input address is the currently addressed column address Ay, it is matched to each of the addresses of the defective columns registered in the defect map buffer. If there is no match at all, the compare circuit 468 basically outputs via a multiple AND gate 469 a NO-MATCH signal M*. This signal M* is used to enable the user-data-transfer-out gates 472 so that the data-out bus 492 can take the data from the addressed data latches 440A. On the other hand, if there is a match, it means the current address location is a defective column and its associated redundant data must be used instead. This is accomplished by the corresponding individual comparator registering a match and outputting a MATCH signal M.

The transfer of redundant data from the redundant data buffer 462 to the data-out bus 492 is controlled by the set of transfer-out gates 482. In particular, bus access to each of the individual registers of the redundant data buffer is controlled by a corresponding transfer-out gate. Thus, when the current address matches a particular defective column address, the MATCH signal M will be used to enable the corresponding transfer-out gate so that, the associated redundant data in the corresponding register of the redundant data buffer 462 can be transferred to the data-out bus 492.

Figure 6:
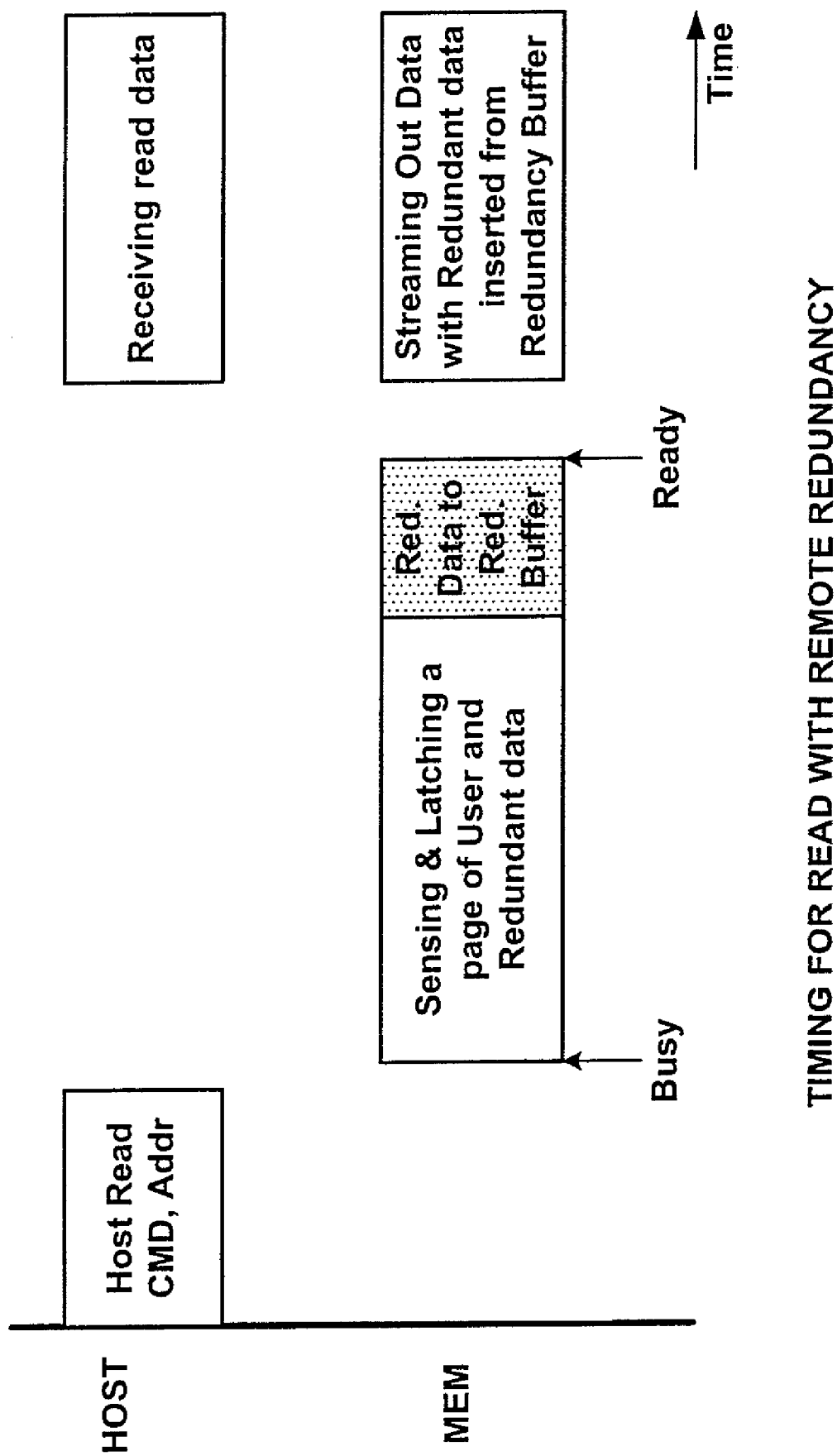
FIG. 6 is a schematic timing diagram of a read operation with the remote redundancy scheme.

FIG. 6 is a schematic timing diagram of a read operation with the remote redundancy scheme. A host initiates the read operation in the memory device by issuing an initial read command to begin sending the starting read address. This is followed by sending the actual starting read address. Then the host issues the command to execute read. The memory device responds with a BUSY signal and proceeds to sense a page of data. The page of sensed data, including user and redundant portions, is latched into the associated data latches 440A and 440A' (see FIG. 5.) After the page of data is latched, the remote redundancy scheme calls for an addition step of copying the redundant data from their latches to the redundant data buffer 462. When the buffered data are in place, the memory device then signals with a READY signal.

The host can then issue a read-out signal to stream out the data from the data latches to the data-out bus 492. During the streaming out operation, whenever a defective column is encountered, the redundant data buffer circuits 460 controls the streaming out to have the data-out bus 492 receive the redundant data from the redundant data buffer 462 instead so that the corresponding redundant data can be inserted into the stream on-the-fly. When the next column encountered is not defective, the redundant data buffer circuits 460 allows the data-out bus 492 to take in the data from the data latches 440A, and this process continues until the end of the page is reached.

Figure 7:
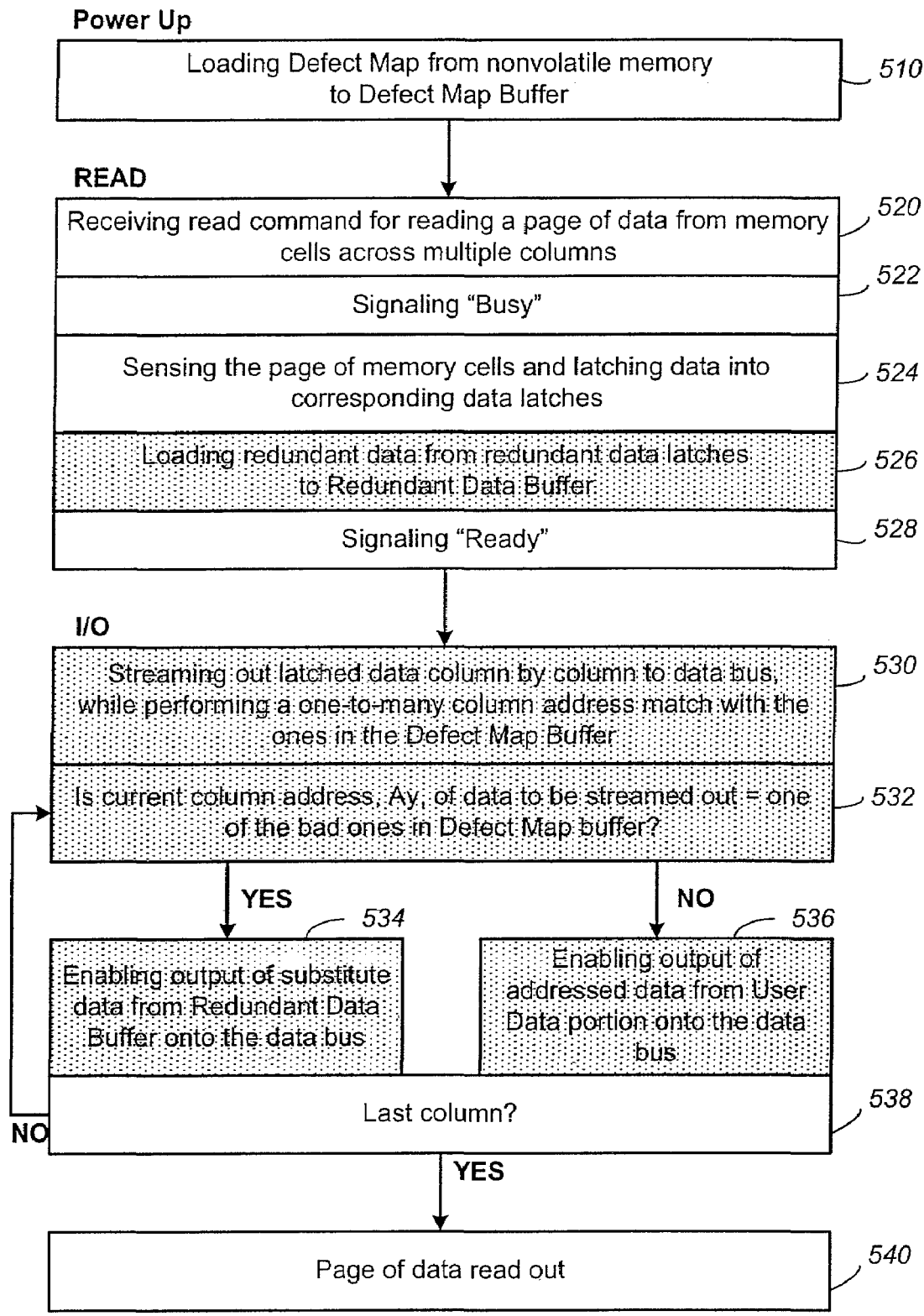
FIG. 7 is a flowchart illustrating a read operation employing the remote redundancy scheme, according to a preferred embodiment.

FIG. 7 is a flowchart illustrating a read operation employing the remote redundancy scheme, according to a preferred embodiment.

Power Up step 510: Loading Defect Map from nonvolatile memory to Defect Map Buffer.

Read step 520: Receiving read command for reading a page of data from memory cells across multiple columns step 522: Signaling "Busy".

step 524: Sensing the page of memory cells and latching data into corresponding data latches.

step 526: Loading redundant data from redundant data latches to Redundant Data Buffer.

step 528: Signaling "Ready".

I/O step 530: Streaming out latched data column by column to data bus, while performing a one-to-many column address match with the ones in the Defect Map Buffer.

step 532: Is current column address Ay of data to be streamed out=one of the bad ones in Defect Map buffer? If there is a match, proceeding to STEP 534, otherwise proceeding to STEP 536.

step 534: Enabling output of substitute data from Redundant Data Buffer onto the data bus, and proceeding to STEP 538.

step 536: Enabling output of addressed data from User Data portion onto the data bus, and proceeding to STEP 338.

step 538: Last column? Proceeding to STEP 540 if the last column is reached, otherwise proceeding to the next column in STEP 534.

step 540: Page of data read out.

Thus, in the present remote redundancy scheme, only addresses for the user portion of the memory array are used. When the current address is for a good (non-defective) location, the data bus takes the data from the data latches. On the other hand, when the current address is for a defective location, the data bus takes the redundant data from a remote buffer.

Figure 8:
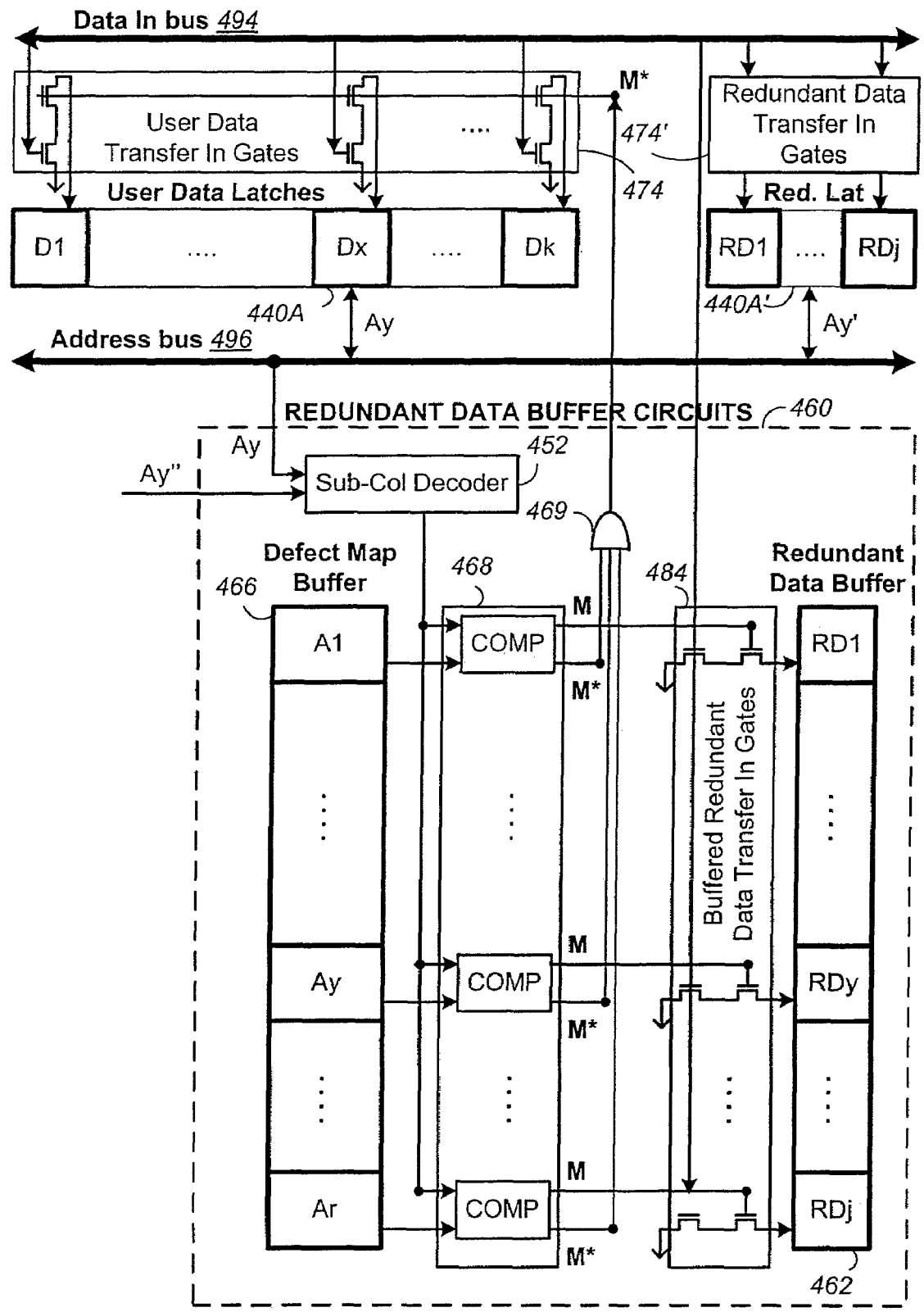
FIG. 8 illustrates the redundant data buffer circuits configured to transfer data from the I/O bus.

FIG. 8 illustrates the redundant data buffer circuits configured to transfer data from the I/O bus. This transfer-in mode is applicable before a program operation when a page of data to be program is to be latched into the set of user data latches 440A. The configuration is similar to that of FIG. 5 except the transfer of data is in the direction coming from the data-in bus 494. A set of user-data-transfer-in gates 474 controls the transfer of the data from the data-in bus 494 to the data latches 440A.

In the transfer-in mode, the redundant data buffer circuits 460 is also similar to that shown in FIG. 5 except a set of transfer-in gates 484 is employed instead of the set of transfer-out gates 482.

Figure 9:
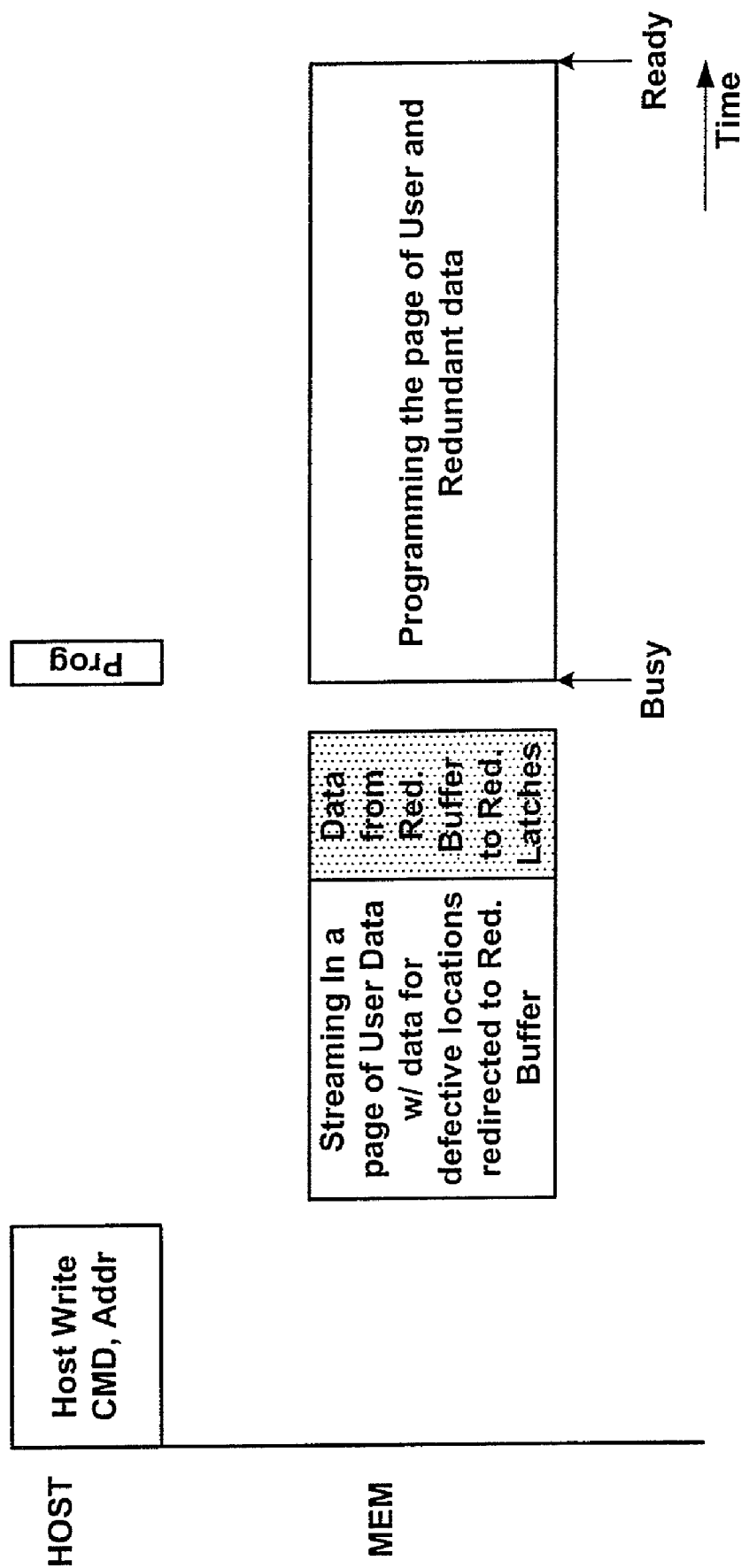
FIG. 9 is a schematic timing diagram of a write operation with the remote redundancy scheme.

FIG. 9 is a schematic timing diagram of a write operation with the remote redundancy scheme. A host initiates the write operation in the memory device by issuing an initial write command to begin sending the starting write address. This is followed by sending the actual starting write address. The host can then issue a signal to stream in the write data from the data-in bus 494 to the data latches 440A (see FIG. 8.) During the streaming in operation, whenever a defective column is encountered, the redundant data buffer circuits 460 will capture the corresponding data for the defective column into the redundant data buffer 462. The streaming process continues until the end of the page is reached. After the page is streamed in, the remote redundancy scheme calls for an addition step of copying the redundant data from the redundant data buffer 462 to their latches 440A'.

Then the host issues the command to execute programming. The memory device then signals a BUSY signal and operates to program a page of data. The page will include the user portion and redundant portion of the array. When all the data are program verified, the memory device signals with a READY signal.

Figure 10:
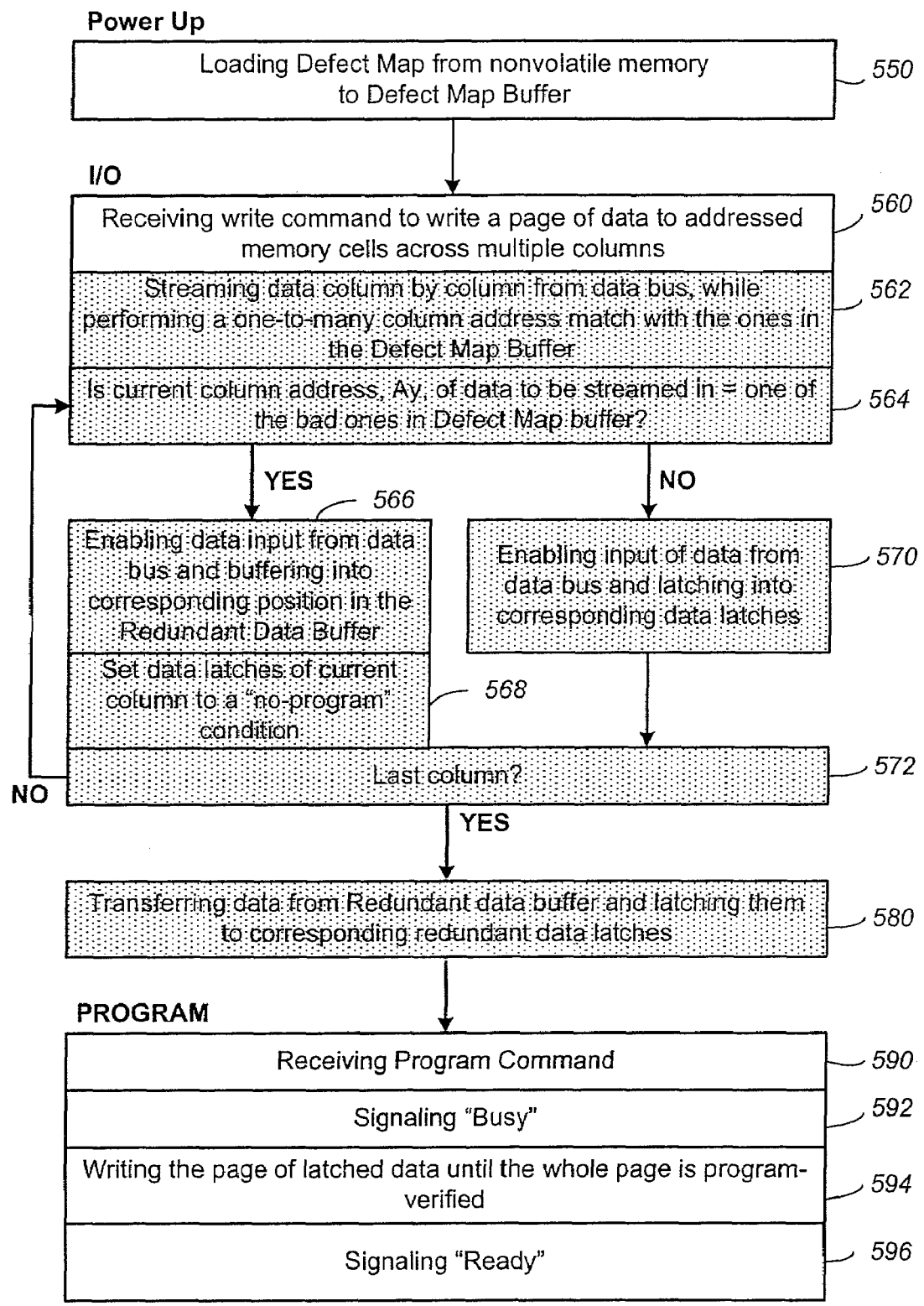
FIG. 10 is a flowchart illustrating a program data loading operation employing the remote redundancy scheme, according to a preferred embodiment.

FIG. 10 is a flowchart illustrating a program data loading operation employing the remote redundancy scheme, according to a preferred embodiment.

Power Up step 550: Loading Defect Map from nonvolatile memory to Defect Map Buffer.

I/O step 560: Receiving write command to write a page of data to addressed memory cells across multiple columns step 562: Streaming data column by column from data bus, while performing a one-to-many column address match with the ones in the Defect Map Buffer.

step 564: Is current column address, Ay, of data to be streamed in=one of the bad ones in Defect Map buffer? If there is a match, proceeding to STEP 566, otherwise proceeding to STEP 570.

step 566: Enabling input of data from data bus and buffering into corresponding position in the Redundant Data Buffer.

step 568: Setting the data latches of current column to a "no-program" condition. Proceeding to STEP 572.

step 570: Enabling input of data from data bus and latching into corresponding data latches.

step 572: Last column? Proceeding to STEP 580 if the last column is reached, otherwise proceeding to the next column in STEP 564.

step 580: Transferring data from redundant data buffer and latching them to corresponding redundant data latches. This is a one-time operation that involves switching to address Ay' to access the redundant array.

Program step 590: Receiving Program Command.

step 592: Signaling "Busy".

step 594: Writing the page of latched data until the whole page is program-verified.

step 596: Signaling "Ready".

Bit Level Redundancy Support

In another embodiment, the address granularity of the redundant data buffer circuits need not be the same as that of the column circuits. Preferably, the unit of address has a finer resolution than that of a column. For example, if a column is of the width of a byte so that a group of eight bit lines are addressed at a time, the redundant data buffer may be addressed at the bit line level.

FIG. 5 and FIG. 8 both show the redundant data buffer circuits 460 to include the optional sub-column decoder 452. The sub-column decoder further decodes the column address Ay and a column offset address Ay" into sub-column addresses. This has the advantage of more efficient utilization of the redundant resource since a single defective bit line can be replaced by another redundant bit line and not necessarily by a redundant column that is eight-bit wide.

Multi-Tier Redundancy Support

For clarity's sake, the remote redundancy scheme employing the redundant data buffer circuits 460 has been described to operate with one set of data latches, such as data latches 440A shown in FIG. 4. It advantage is apparent since the slow 2-way addressing scheme of the prior art is avoided as only the user address is used.

Another advantage is also gained when there are more than one set of column circuits in operation. As mentioned in connection with FIG. 4, due to localization of the redundant data at the latches of the substitute column in prior art systems, a further issue may arise when there is more than one tier of column circuits. For example, a set of even column circuits can only access even columns and therefore not be able to use any odd redundant columns, similarly for odd column circuits. The present scheme allows all the redundant data to be buffered in a central location that can be accessible by any number of column circuits regardless of their relative locations.

Figure 11:
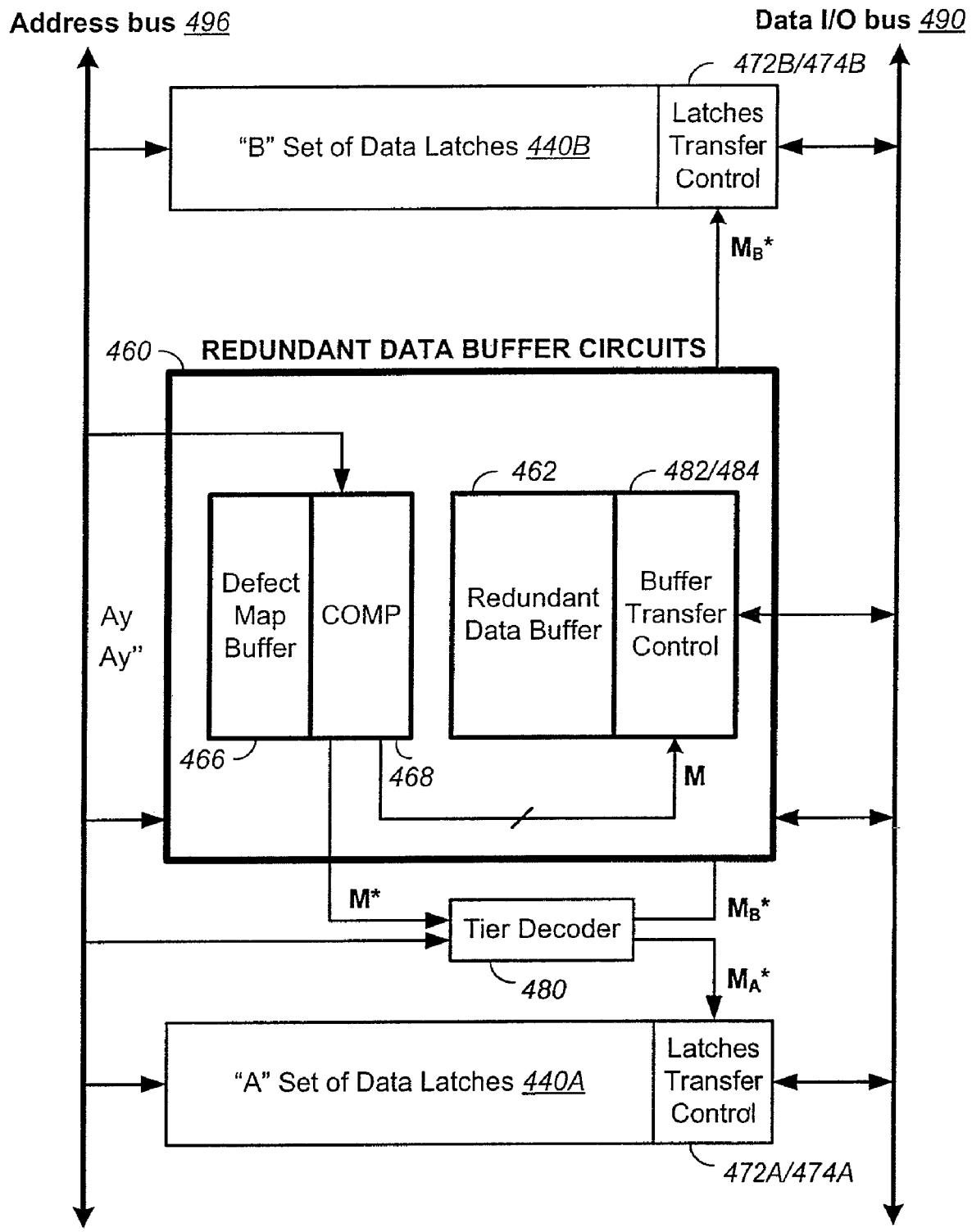
FIG. 11 illustrates schematically the redundant data buffer circuits servicing two sets of data latches and the data bus.

FIG. 11 illustrates schematically the redundant data buffer circuits servicing two sets of data latches and the data bus. In this configuration, the redundant data buffer circuits 460 operates with the "A" set of data latches 440A in the same manner as that shown in FIG. 5 and FIG. 8. Even with the additional "B" set of data latches 440B, the principles are the same. That is the redundant data buffer circuits are used to control bus exchange either between the "A" or "B" set of data latches on the one hand, and the redundant data buffers 462 on the other hand. In one embodiment, the signal M for enabling data latches transfer is further decoded by a tier decoder 480 using the Ay address range to produce either $M_A^*$ or $M_B^*$ enabling signal, respectively for the "A" set or the "B" set.

Thus, when the "A" set of data latches are in operation, bus transfer with the data latches 440A is enabled by $M_A^*$ on latches transfer control 472A/474A. When the "B" set of data latches are in operation, bus transfer with the data latches 440B is enabled by $M_B^*$ on latches transfer control 472B/474B. This is so when the current address does not match any of the addresses in the defect map buffer 466. On the other hand, whenever there is a match, the signal $M_A^*$ or $M_B^*$ becomes inactive and the buffer transfer control 482/484 is enabled by the signal M. This results in data being exchanged instead between the data bus 492 and corresponding registers within the redundant data buffer 462.

Redundant Data Buffered in Data Latches of Defective Columns

According to another aspect of the invention, a defective column latching redundancy scheme has the redundant or substitute data for defective memory locations relocated from the redundant data latches to a more readily accessible location such as the data latches of the corresponding defection columns. This scheme is predicated on the fact that a defective column is usually caused by problems in the bit lines and not so much in the associated column circuits. Thus for example, while the bit lines may be shorted and become unusable, their associated data latches and column decoders are likely to remain operational. The invention recognizes that when memory operations such as sensing and programming can not be performed via the defective bit lines, they column circuits can still be used to buffer data.

In a preferred embodiment, the data latches associated with the defective locations are employed to buffer the substitute data that are conventionally stored in the data latches associated with the corresponding redundant locations. In this way, the user portion of can be treated as if virtually free of defects as far as streaming data out to the data bus is concerned. Thus, only the addressing scheme for addressing the user portion is needed and there is no need to switch to the redundant data latches whenever a defective location is encountered.

In a read operation, after the page including both user and redundant data are sensed and latched. An additional operation is called for to place a copy of the redundant data from the redundant data latches to the data latches associated with the corresponding defective columns in the user portion. In this way, when the data is output to a data bus, only the user data latches need be accessed, regardless of any defective columns.

In a write operation, a page of data to be written is first latched into the user data latches regardless of any defective columns. In this way, the user portion can be treated as if virtually free of defects as far streaming in data from the data bus is concerned. An additional operation is called for to place a copy of the data from the data latches associated with the defective columns to corresponding redundant data latches. Predefined data indicating a no-program condition are also stored into the data latches of the defective column to indicate them as such. Then the whole page including data from both the user data latches and the redundant data latches can be programmed into the respective memory cells.

Figure 12:
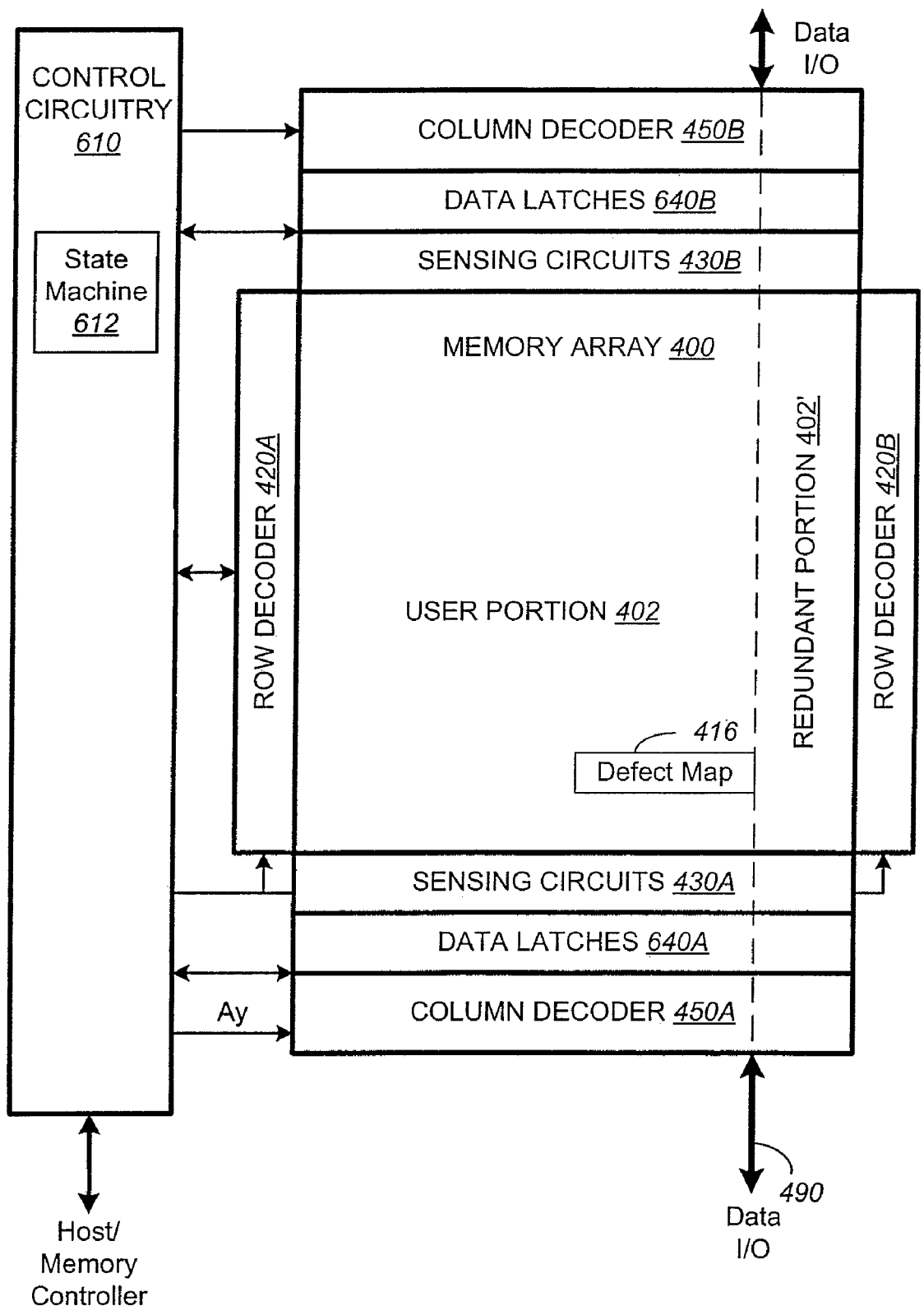
FIG. 12 illustrates schematically a preferred arrangement of a compact memory device that provides the context in which the defective column latching redundancy scheme is implemented.

FIG. 12 illustrates schematically a preferred arrangement of a compact memory device that provides the context in which the defective column latching redundancy scheme is implemented. The memory device essentially has a similar structure as that shown in FIG. 4 but without the need of the redundant data buffer circuits 460. In particular, the memory device includes a two-dimensional array of memory cells 400, control circuitry 610, row decoders 420A and 420B, and column circuits.

The memory array 400 is addressable by word lines via the row decoders 420A, 420B and by bit lines coupled to the column circuits. The column circuits includes sensing circuits 430A, 430B, data latches 640A, 640B and column decoders 450A, 450B and data I/O bus 490. As mentioned before in connection with FIG. 4, it will be understood that there is a set of data latches for each sensing circuit.

In the preferred embodiment, there is a sensing circuit among circuits 430A coupled to all the even bit lines and a sensing circuit among circuits 430B coupled to all the odd bit lines. In this way, when operating together, all the bit lines are being used in parallel. In another embodiment, only every other bit lines, even or odd, are operating in parallel.

The row decoders and the column circuits are preferably distributed on both ends of the array in order to accommodate dense packing. Hence, row decoders 420A and 420B are respectively deployed at the left and right sides of the array. Similarly, column circuits "A" and "B" are respectively deployed at the bottom and top of the array. Typically, column circuits "A" and "B" respectively access interleaving sets of bit lines. For example, column circuits "A" have access to even number bit lines and column circuits "B" have access to odd number bit lines. For expediency, unless specifically noted, hereinafter the description will be directed to a generic set of the circuits, with the "A" or "B" appendix in the numeral reference dropped.

The sensing circuits 430 of the column circuits are implemented as a bank of sense amplifiers that allows a block (also referred to as a "page") of memory cells along a row to be read or programmed in parallel. In a preferred embodiment, a page is constituted from a contiguous row of memory cells, such as 1024 bytes. In another embodiment, where a row of memory cells are partitioned into multiple blocks or pages.

The control circuitry 610 cooperates with row decoders and the column circuits to perform memory operations on the memory array 400. A state machine 612 in the control circuitry provides chip-level control of memory operations.

The memory array 400 is further partitioned into a user portion 402 and a redundant portion 402'. The user portion 402 is accessible column by column by user address Ay supplied via an address bus 496. The redundant portion 402' can not be accessed by the user and has its own protected addressing Ay'. The redundant portion provides a predetermined number of redundant or substitute columns for replacement of any defective columns found in the user portion. A listing of defective columns is registered in a defect map 416, which is preferably stored in the non-volatile memory array 402. For example, the redundant region 402' may provide eight substitute columns each being one byte wide. This would in principle allow replacement of up to eight defective columns that may arise in the user portion.

In the column circuit structure shown in FIG. 12, the exchange of data between a group of user data latches 640 and the data-in bus 494 is controlled by the user column decoder 450. The user column decoder 450 decodes a user column address Ay and allows access of the group of data latches in the user column to access the data-in bus 494. Similarly, the exchange of data between a group of redundant data latches 640' and the data-in bus 494 is controlled by the redundant column decoder 450'. The redundant column decoder 450' decodes a redundant column address Ay' and allows access of the group of data latches in the redundant column to access the I/O bus.

The invention provides additional structure to allow shuttling of data between the data latches of a user column and a redundant column.

Figure 13:
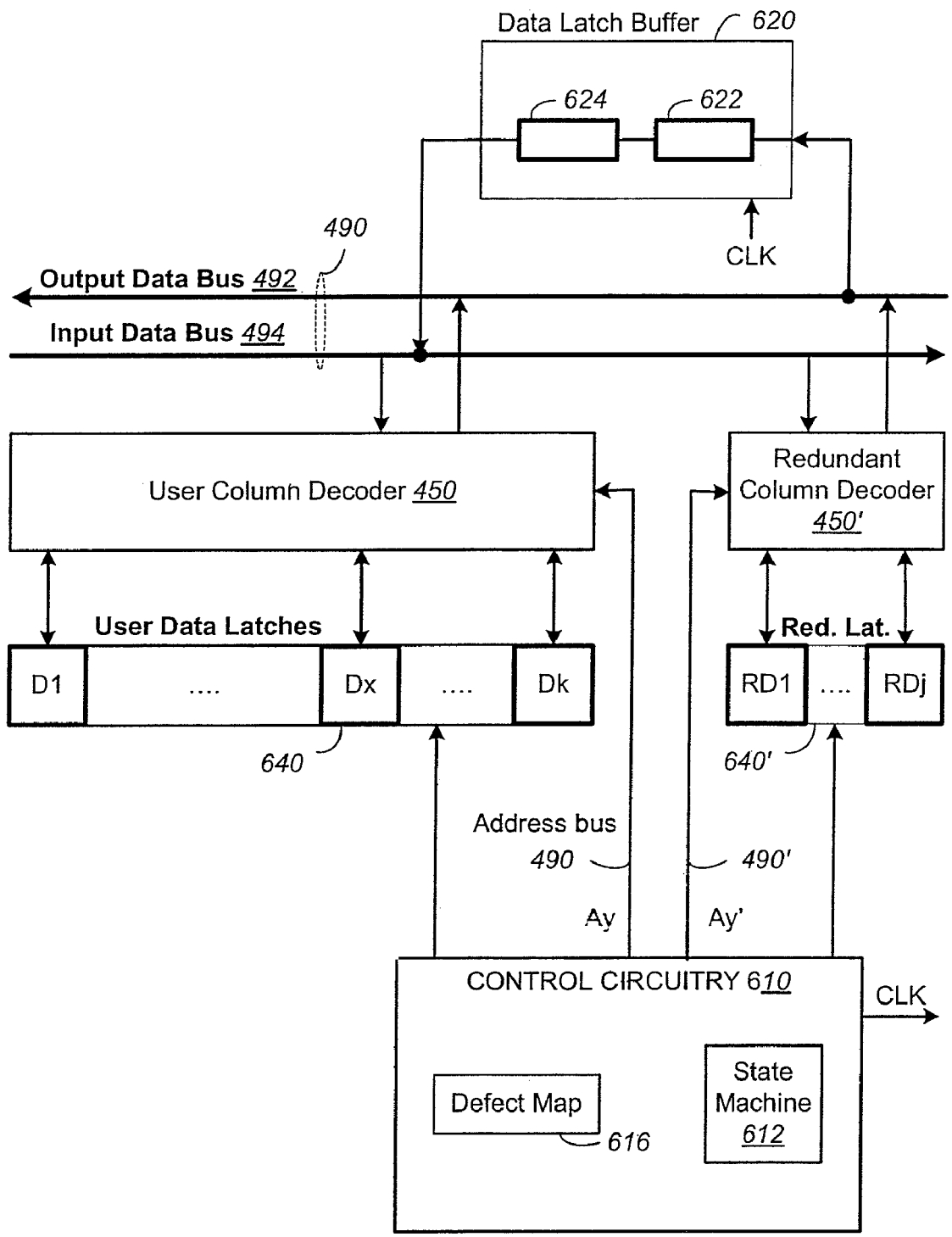
FIG. 13 illustrates schematically a data latch buffer for shuttling data between the user and redundant data latches in order to implement another column redundancy scheme without the need to employ 2-way addressing.

FIG. 13 illustrates schematically a data latch buffer for shuttling data between the user and redundant data latches in order to implement another column redundancy scheme without the need to employ 2-way addressing.

In the preferred embodiment, a data latch buffer 620 is provided between the output data bus 492 and the input data bus 494. The data latch buffer 620 includes a first shift register 622 and a second shift register 644 connected in series. The first shift register 622 and second shift register 624 operate in a pipeline manner, with data units from the output bus 492 being shifted through the two registers and returned to the input bus 494 unit by unit as controlled by a clock signal CLK. In this way, both the output and input portion of the I/O bus 490 can be operating at the same time.

A control circuitry 610 provides the addressing and transfer control between the data latches of a user column and a redundant column. For example, after a page of data has been latched in the user data latches 450 and redundant data latches 450', the data in the redundant data latches 450' will be copied to the corresponding data latches of the defective columns. The control circuitry 610 provides the redundant column address Ay' to the redundant column decoder 450' and shifts the redundant data units from the redundant data latches 640' via the data output bus 492 one by one into the data latch buffer 620. The shifted redundant data units emerge out of the other end of the data latch buffer and enter the input data bus 494. By referencing a defect map 616 loaded into the control circuitry 610, an corresponding defective column address Ay is generated and used by the user column decoder 450 to direct the redundant data unit units to their corresponding latches in the defective columns.

Similarly principles apply in the transfer from the data latches of the defective columns to the corresponding redundant data latches. In this case, based on the defect map, the data latches of the defective columns are accessed one by one and shifted through the data latch buffer 620. At the other end of the data latch buffer, the redundant data units are directed to their respective redundant data latches via appropriate decoding of Ay' by the redundant column decoder 450'.

Figure 14:
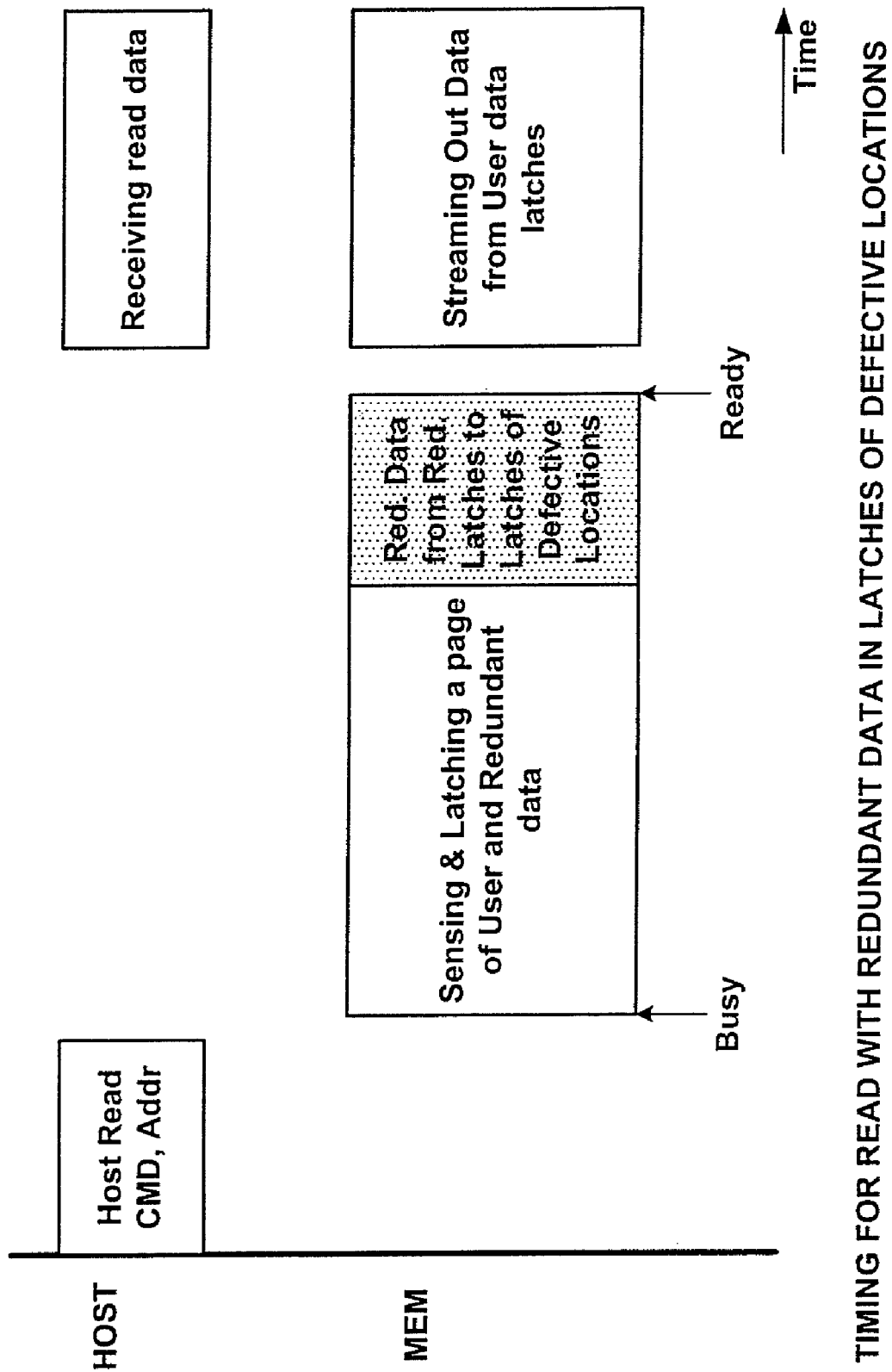
FIG. 14 is a schematic timing diagram of a read operation with the defective column latching redundancy scheme.

FIG. 14 is a schematic timing diagram of a read operation with the defective column latching redundancy scheme. A host initiates the read operation in the memory device by issuing an initial read command to begin sending the starting read address. This is followed by sending the actual starting read address. Then the host issues the command to execute read. The memory device responds with a BUSY signal and proceeds to sense a page of data. The page of sensed data, including user and redundant portions, is latched into the associated data latches 440A and 440A' (see FIG. 13.) After the page of data is latched, the defective column latching redundancy scheme calls for an addition step of copying the redundant data from their latches to the data latches of the corresponding defective columns. After the redundant data are latched in the corresponding defective columns, the memory device then signals with a READY signal. Essentially, when the memory device has a predefined timing specification, the addition step must be completed within the maximum time allowed for the period demarcated by BUSY and READY.

The host can then issue a read-out signal to stream out the data from the user data latches 440 to the data-out bus 492. Since the data latches of the defective columns now contain the corresponding redundant data, there is no need to retrieve them from the redundant data latches 440' using a second set of address Ay' as in the conventional case.

Figure 15:
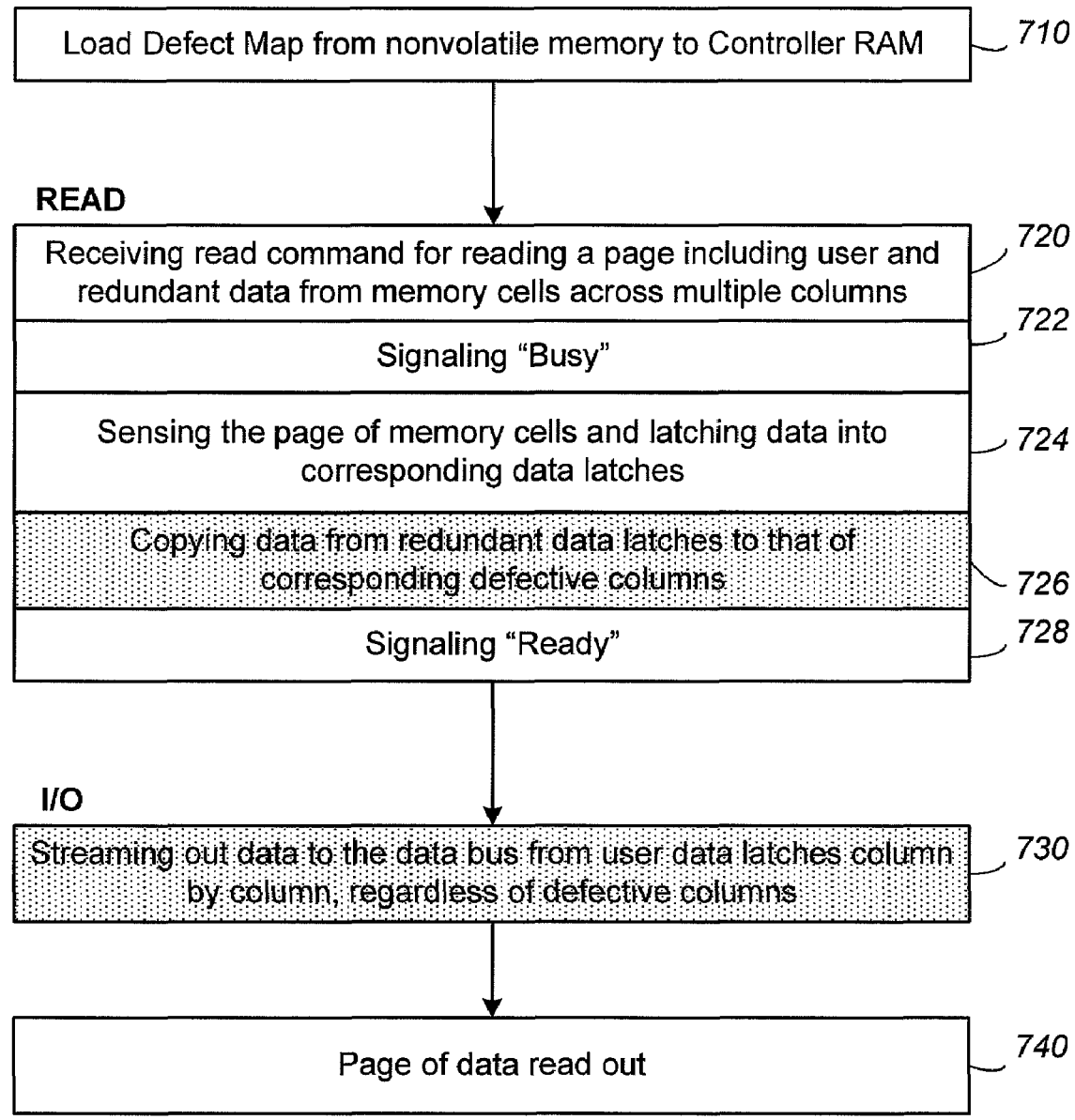
FIG. 15 is a flowchart illustrating a read operation employing the defective column latching redundancy scheme, according to a preferred embodiment.

FIG. 15 is a flowchart illustrating a read operation employing the defective column latching redundancy scheme, according to a preferred embodiment.

Power Up step 710: Loading Defect Map from nonvolatile memory to Controller RAM.

Read step 720: Receiving read command for reading a page including user and redundant data from memory cells across multiple columns step 722: Signaling "Busy".

step 724: Sensing the page of memory cells and latching data into corresponding data latches.

step 726: Copying data from redundant data latches to that of corresponding defective columns.

step 728: Signaling "Ready".

I/O step 730: Streaming out data to the data bus from user data latches column by column, regardless of defective columns.

step 740: The page of data is read out.

Thus, in the present defective column latching redundancy scheme, only addresses for the user portion of the memory array are used to stream out the data and only the user data latches need be accessed.

Figure 16:
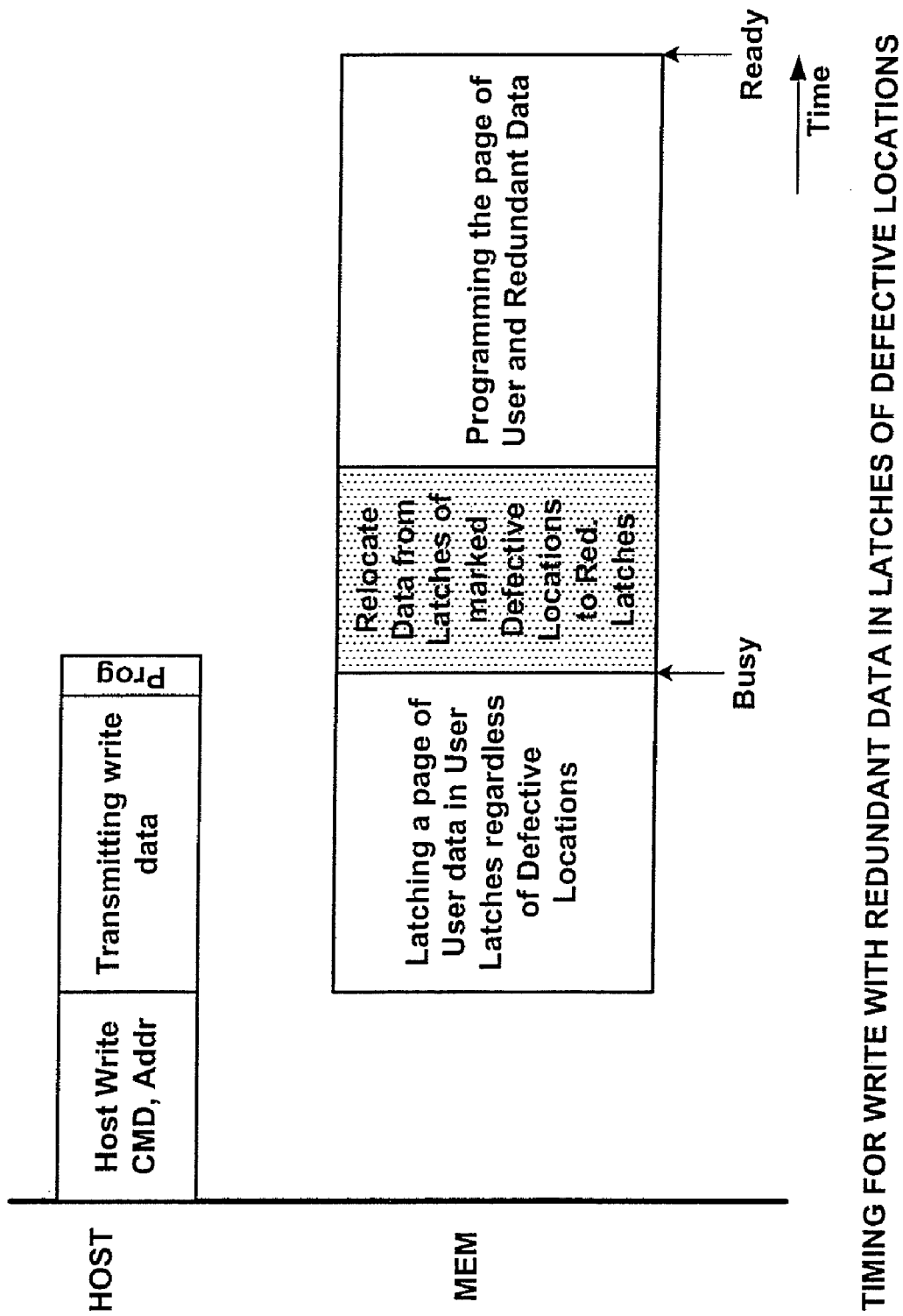
FIG. 16 is a schematic timing diagram of a write operation with the defective column latching redundancy scheme.

FIG. 16 is a schematic timing diagram of a write operation with the defective column latching redundancy scheme. A host initiates the write operation in the memory device by issuing an initial write command to begin sending the starting write address. This is followed by sending the actual starting write address. The host can then issue a signal to stream in the write data from the data-in bus 494 to the data latches 440 (see FIG. 8.) regardless of whether the corresponding column is defective or not. Then the host issues the command to execute programming. The memory device then signals a BUSY signal as if it is proceeding to program a page of data. However, the control circuitry (see FIG. 13) defers the actual programming as the defective column latching redundancy scheme calls for an addition step of copying the data from the latches of the defective columns to the redundant data latches of the corresponding redundant columns. After copying the data, the latches of the defective columns are set to a predetermined value to indicate a condition of no-programming.

The control circuitry then proceeds to program the page in the memory. The page will include the user portion and redundant portion of the array. When all the data are program verified, the memory device signals with a READY signal.

Figure 17:
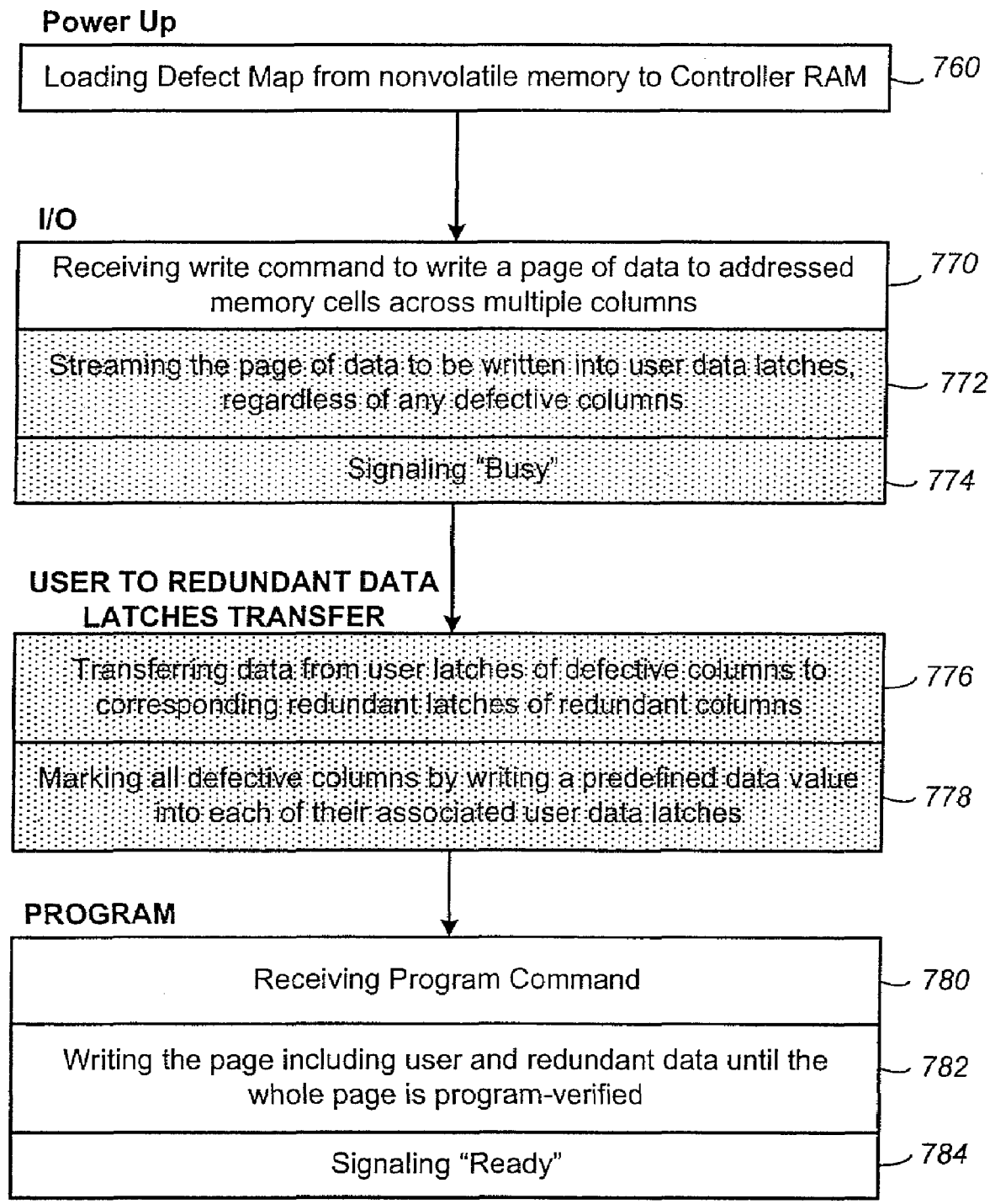
FIG. 17 is a flowchart illustrating a program data loading operation employing the defective column latching redundancy scheme, according to a preferred embodiment.

FIG. 17 is a flowchart illustrating a program data loading operation employing the defective column latching redundancy scheme, according to a preferred embodiment.

Power Up step 760: Loading Defect Map from nonvolatile memory to the controller RAM.

I/O step 770: Receiving write command to write a page of data to addressed memory cells across multiple columns.

step 772: Streaming the page of data to be written into user data latches, regardless of any defective columns.

step 774: Signaling "Busy".

User to Redundant data latches Transfer step 776: Transferring data from user latches of defective columns to corresponding redundant latches of redundant columns.

step 778: Marking all defective columns by writing a predefined data value into each of their associated user data latches.

Program step 780: Receiving Program Command.

step 782: Writing the page including user and redundant data until the whole page is program-verified.

step 784: Signaling "Ready".

While the description has been made with examples for various column redundancy schemes, those skilled in the art will readily appreciate other replacement units for a defective memory location is possible.

Although the various aspects of the present invention have been described with respect to certain embodiments, it is understood that the invention is entitled to protection within the full scope of the appended claims.

What is claimed is:

1. A method of reading data from a first group of memory locations in parallel, comprising:
    providing a list of defective locations among the first group of memory locations;
    storing data slated for the defective locations in a second group of redundant memory locations;
    providing a first group of data latches for latching data associated with the first group of memory locations and a second group of data latches for latching redundant data associated with the second group of redundant memory locations;
    sensing the data of the first and second group of memory locations;
    latching the sensed data into the first group and redundant data into the second group of data latches;
    transferring redundant data from the second group of data latches to data latches of corresponding to defective locations in the first group; and
    reading out the data from the data latches of the first group to a data bus regardless of any defective memory locations in the first group.

2. The method as in claim 1, wherein:
    the first and second group of memory locations are addressable by rows and columns; and
    each defective location in the first group is part of a defective column replaceable by a corresponding redundant location in the second group, the corresponding redundant location being a part of a redundant column.

3. The method as in claim 1, wherein:
    said reading out the data to a data bus is according to an address for accessing the first group.

4. The method as in claim 1, further comprising:
    said transferring redundant data between the data latches of the redundant latches of the second group and that of the corresponding defective memory locations further comprises:
    coupling the data latches of the redundant latches of the second group to an output portion of the data bus;
    coupling the data latches of corresponding defective memory locations in the first group to an input portion of the data bus; and
    buffering the data transferred between the output and input portions of the data bus.

5. The method as in claim 4, wherein:
    said buffering the data transferred between the output and input portions of the data bus is by shifting through a set of pipelined registers.

6. The method as in claim 5, wherein:
    said set of pipelined registers is a set of two-stage shift registers.

7. The method as in claim 1, wherein the non-volatile memory is flash EEPROM.

8. The method as in claim 1, wherein the non-volatile memory is embodied in a memory card.

9. The method as in any one of claims 1-8, wherein individual memory locations of the non-volatile memory each stores one of two memory states.

10. The method as in any one of claims 1-8, wherein individual memory locations of the non-volatile memory each stores one of more than two memory states.

11. A method of writing data to a first group of memory locations, comprising:
    providing a list of defective locations among the first group of memory locations;
    providing a second group of redundant memory locations for storing redundant data associated with the defective locations;
    providing a first group of data latches for latching data to be written to the first group of memory locations and a second group of data latches for latching redundant data to be written to the second group of redundant memory locations;
    latching the data to be written from a data bus into the first group of data latches regardless of any defective memory locations in the first group of memory locations;
    transferring data from the data latches for defective memory locations in the first group to the data latches of corresponding redundant locations in the second group;
    indicating a no-program condition for the defective memory locations by storing a predefined data into the data latches of the first group for the defective memory locations; and
    programming the data from the first group of data latches into the first group of memory locations and the redundant data from the second group of data latches into the second group of redundant memory locations.

12. The method as in claim 11, wherein:
the first and second group of memory locations are addressable by rows and columns; and
each defective location in the first group is part of a defective column replaceable by a corresponding redundant location in the second group, the corresponding redundant location being a part of a redundant column.

13. The method as in claim 11, wherein:
said latching the data to be written from the data bus is according to an address for accessing the first group of memory locations.

14. The method as in claim 11, wherein:
said transferring data between the data latches for defective memory locations in the first group and that of the corresponding redundant locations in the second group further comprises:
coupling the data latches for defective memory locations to an output portion of the data bus;
coupling the data latches of corresponding redundant locations to an input portion of the data bus; and
buffering the data transferred between the output and input portions of the data bus.

15. The method as in claim 14, wherein:
said buffering the data transferred between the output and input portions of the data bus is by shifting through a set of pipelined registers.

16. The method as in claim 15, wherein:
said set of pipelined registers is a set of two-stage shift registers.

17. The method as in claim 11, wherein the non-volatile memory is flash EEPROM.

18. The method as in claim 11, wherein the non-volatile memory is embodied in a memory card.

19. The method as in any one of claims 11-18, wherein individual storage locations of the non-volatile memory each stores one of two memory states.

20. The method as in any one of claims 11-18, wherein individual storage locations of the non-volatile memory each stores one of more than two memory states.

* * * * *